United States Patent [19]

Zook

[11] Patent Number: 5,727,003

[45] Date of Patent: Mar. 10, 1998

[54] METHOD AND APPARATUS FOR FLASH BURST ERROR CORRECTION

[75] Inventor: Christopher P. Zook, Longmont, Colo.

[73] Assignee: Cirrus Logic, Inc., Fremont, Calif.

[21] Appl. No.: 498,275

[22] Filed: Jul. 3, 1995

[51] Int. Cl.[6] .................................................. H03M 13/00
[52] U.S. Cl. ........................ 371/39.1; 371/37.1; 371/37.7; 371/38.1; 371/39.1; 371/40.3
[58] Field of Search ................................ 371/37.1–37.9, 371/38.1, 39.1

[56] References Cited

U.S. PATENT DOCUMENTS

| | | | |
|---|---|---|---|
| 4,597,083 | 6/1986 | Stenerson | 371/37.1 |
| 4,782,490 | 11/1988 | Tenengolts | 371/40 |
| 4,916,702 | 4/1990 | Berlekamp | 371/39.1 |
| 4,951,284 | 8/1990 | Abdel-Ghaffar et al. | 371/38.1 |
| 5,592,404 | 1/1997 | Zook | 364/746.1 |

*Primary Examiner*—Reba I. Elmore
*Assistant Examiner*—Emmanuel L. Moise
*Attorney, Agent, or Firm*—H. Warren Burnam, Jr.; Dan A. Shifrin

[57] ABSTRACT

An error correction system (20) operates on clock cycles to decode a sequence of error correcting symbols (R(x)) received from a disk drive (24), and alternatively to encode data in a codeword for storage on a disk drive. The system includes a generator (30) which, during decoding, receives symbols of the sequence during a plurality of reception clock cycles. During the reception clock cycles the generator generates error pattern bits, regenerated CRC values, syndromes, and parity values. Also during the reception clock cycles the generator uses the regenerated CRC values and CRC symbols of the sequence to generate CRC check values. An error address determinator (90) uses the syndromes and parity values to determine, during a last of the reception clock cycles, a reference address (L) of an error burst in a data symbol portion of the sequence. An error pattern generator (80) then efficiently inserts the error pattern bits at the reference address in an output error pattern during a very next clock cycle.

74 Claims, 9 Drawing Sheets

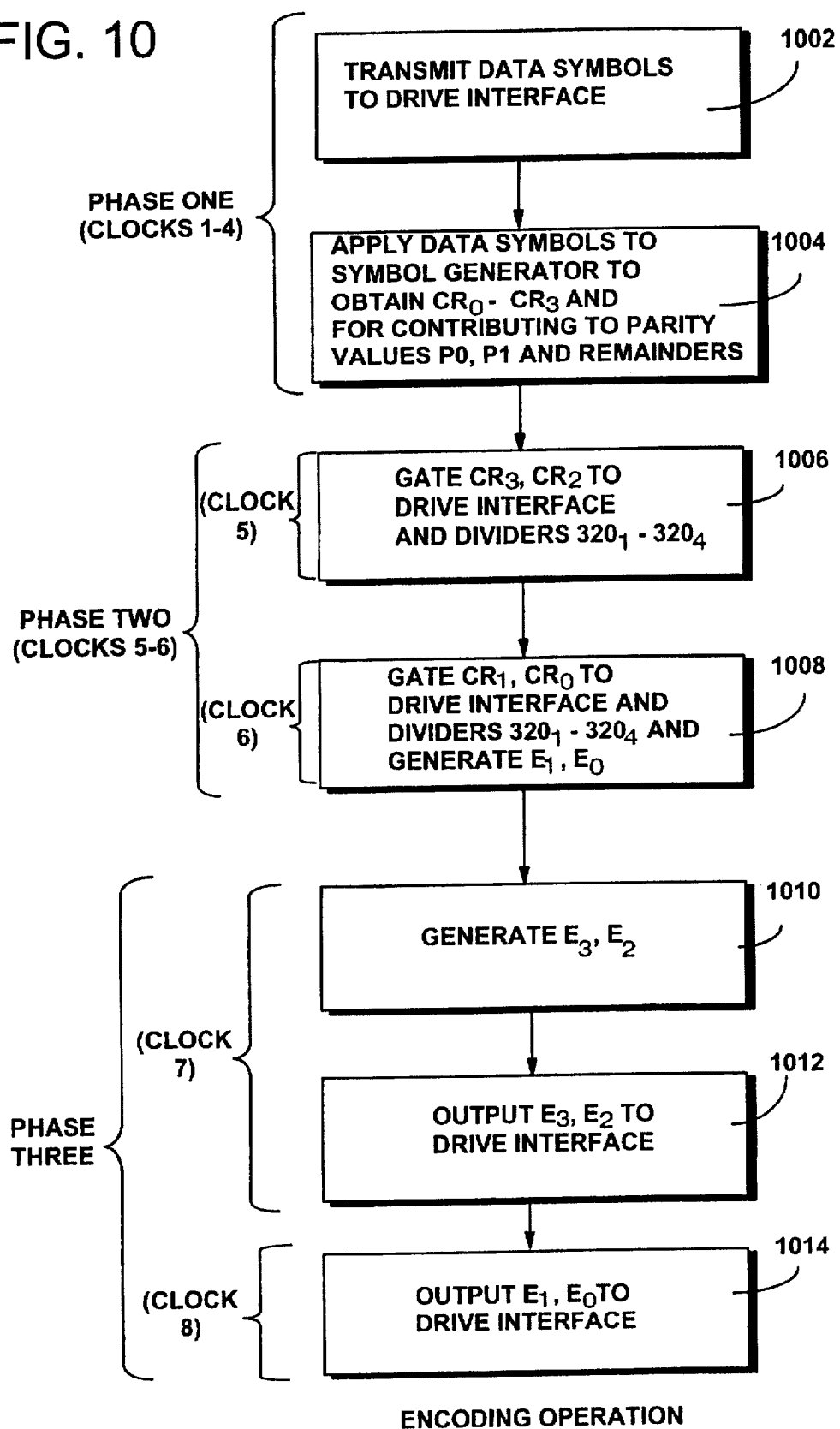

DECODING OPERATION

METHOD AND APPARATUS FOR FLASH BURST ERROR CORRECTION

BACKGROUND

1. Field of Invention

This invention relates generally to digital data communication systems, particularly to the encoding and decoding of error correcting codes.

2. Related Art and Other Considerations

In a digital data communication system (including storage and retrieval from optical or magnetic media), in order to increase the transfer rate of information or increase storage density and at the same time make the error rate arbitrarily low, it is necessary to employ an error control system. For limited signal power levels and limited bandwidths improvements can be made through the use of error-correcting codes.

With error-correction, coding the data to be transmitted or stored is mathematically processed through appropriate circuitry and/or software to obtain additional data symbols called check symbols or redundancy symbols. The data and check symbols together make up a codeword. After the codeword is transmitted to and received from the communication channel or retrieved from storage the codeword is mathematically processed to obtain error syndromes which contain information about locations and values of errors. Some applications, e.g. the reading of ID fields on magnetic disk, necessitate the use of codes which can quickly correct short bursts in a small block of data in real time. Pad bytes must be recorded between ID fields and data fields to provide time for the correction of the ID field before the data field can be written or read. Ideally, the ID field would be corrected instantaneously, i.e. "flash" corrected immediately following the reception of the last ID field byte.

For fast burst correction, the related art typically employs one of two methods: (1) decoding a multiple-error correcting code (e.g. a Reed-Solomon code) using burst trapping; and (2) interleaving a single-error correcting code. The first method is described in Peterson's and Weldon's *Error-Correcting Codes*, second edition, published by the MIT Press, p. 364 and the second method is described on page 357 of that text.

For applications wherein the codeword is transmitted or stored in serial format, e.g. magnetic disk, the byte correcting ability of the code causes an inefficiency. For example, if the code is based on 8-bit symbols, then a two-byte correcting code employing 32 redundancy bits can only guarantee to correct a 9-bit burst since a 10-bit burst could affect three bytes. If the code were based on 4-bit symbols, then a three-symbol correcting code employing 24 redundancy bits can guarantee to correct a 9-bit burst but the length of the codeword would be reduced from 255 bytes to 7.5 bytes. Although burst trapping is simple to implement it is inherently sequential in nature and would require excessive circuitry to modify for flash correction.

If the interleaving method is used such that a codeword capable of correcting a single 4-bit symbol is interleaved to degree three, then all single 9-bit bursts could be corrected and the codeword length would be 22.5 bytes. Also, flash correction is fairly simple for single error-correcting codes.

The disadvantage of the interleaving method is that, whereas the 4-bit symbol code in the first example has a minimum distance of seven (i.e. requires at least seven symbols in error to be an undetectable error), the individual codewords of the interleaving method in the second example each have minimum distance of three. This means that the first code, employing burst trapping, can detect as uncorrectable all random errors of two or three symbols but the second code can fail to detect such errors if they are contained entirely within one interleave. Also each additional redundancy symbol which is added to the first code increases the minimum distance by one but there is no way to add an additional redundancy symbol to the second code which will increase the minimum distance by one.

A desired solution would have the advantages of both methods without the disadvantages, i.e. small symbol size for efficient correction, detection redundancy which increases the minimum distance by one for each one added and a simple flash correction method.

SUMMARY

An error correction system operates on clock cycles to decode a sequence of error correcting symbols received from a disk drive, and alternatively to encode data in a codeword for storage on a disk drive. The system includes a generator which, during decoding, receives symbols of the sequence during a plurality of reception clock cycles. During the reception clock cycles the generator generates error pattern bits, regenerated CRC values, syndromes, and parity values. Also during the reception clock cycles the generator uses the regenerated CRC values and CRC symbols of the sequence to generate CRC check values. An error address determinator uses the syndromes and parity values to determine, during a last of the reception clock cycles, a reference address of an error burst in a data symbol portion of the sequence. An error pattern generator then efficiently inserts the error pattern bits at the reference address in an output error pattern during a very next clock cycle.

For purposes of checking or verifying correction/decoding, a circuit is provided for generating factors for determining error CRC values. A calculator generates negative logarithm values of (1) the CRC check values, and (2) the error CRC values. A controller evaluates negative logarithm values of (1) the CRC check values, and (2) the error CRC values to verify accurate generation of the output error pattern. In an illustrated embodiment, two symbols from the sequence are received from the disk drive during each reception clock cycle. Advantageously, the circuit for generating factors for determining error CRC values, also known as a linear combination circuit, is also used to linearly combine symbols in a manner to enable the generator to generate regenerated CRC values.

In one mode of the invention, data symbols of the sequence received from the disk drive contain sector identifying information. The sequence received from the disk drive consists of eight bytes, and wherein eight error pattern bits are generated by the error pattern generator. The received sequence is R(x), wherein the plurality of syndromes include a first syndrome S1 and a second syndrome S2, and wherein $S1=R(\alpha)\alpha^{-1}$ and $S2=R(\alpha^2)\alpha^{-2}$. Since two symbols from the sequence are received from the disk drive during each reception clock cycle, the plurality of parity values includes an even symbol interleave parity value and an odd symbol interleave parity value. The generator generates a plurality of reference address candidates, and wherein the address determinator is used to select one of the reference address candidates to be the reference address "L" based on a predetermined selection rule.

For encoding, the generator uses the received data to generate a codeword comprising data symbols, a plurality of CRC symbols generated over the data symbols, and error correction symbols $E_0$, $E_1$, $E_2$, and $E_3$ generated over both the data symbols and the CRC symbols. The error correction symbols are generated whereby $E_2$ and $E_3$ symbols are parity symbols over the entire codeword divided into two interleaves and $E_1$ and $E_0$ are chosen so that the codeword polynomial has $\alpha^2$ and $\alpha^1$ as roots.

The generator comprises a plurality of divider circuits which are grouped into first, second, and third sets. During an encoding operation, the third set of dividers is used to produce CRC symbols; the first set of dividers is sued to generate even and odd parity values P0 and P1; and, the second set of dividers is used to output error correction symbols $E_0$ and $E_1$ as well as to generate error correction symbols $E_2$ and $E_3$. For decoding and checking operations, the first set of dividers is used to generate even and odd parity values P0 and P1 (which also are error pattern bits); the second set of dividers is used to generate syndromes S1 and S2, as well as to store a reference address value (LSAVE); and the third set of dividers is used for multitudinous purposes including generation of regenerated CRC values; addition of the regenerated CRC values to sequence-received CRC values; and generation of CRC check values, for example.

BRIEF DESCRIPTION OF THE DRAWINGS

The foregoing and other objects, features, and advantages of the invention will be apparent from the following more particular description of preferred embodiments as illustrated in the accompanying drawings in which reference characters refer to the same parts throughout the various views. The drawings are not necessarily to scale, emphasis instead being placed upon illustrating the principles of the invention.

FIG. 10 is a flowchart showing general steps executed in an encoding operation.

DETAILED DESCRIPTION OF THE DRAWINGS

Figure 1:
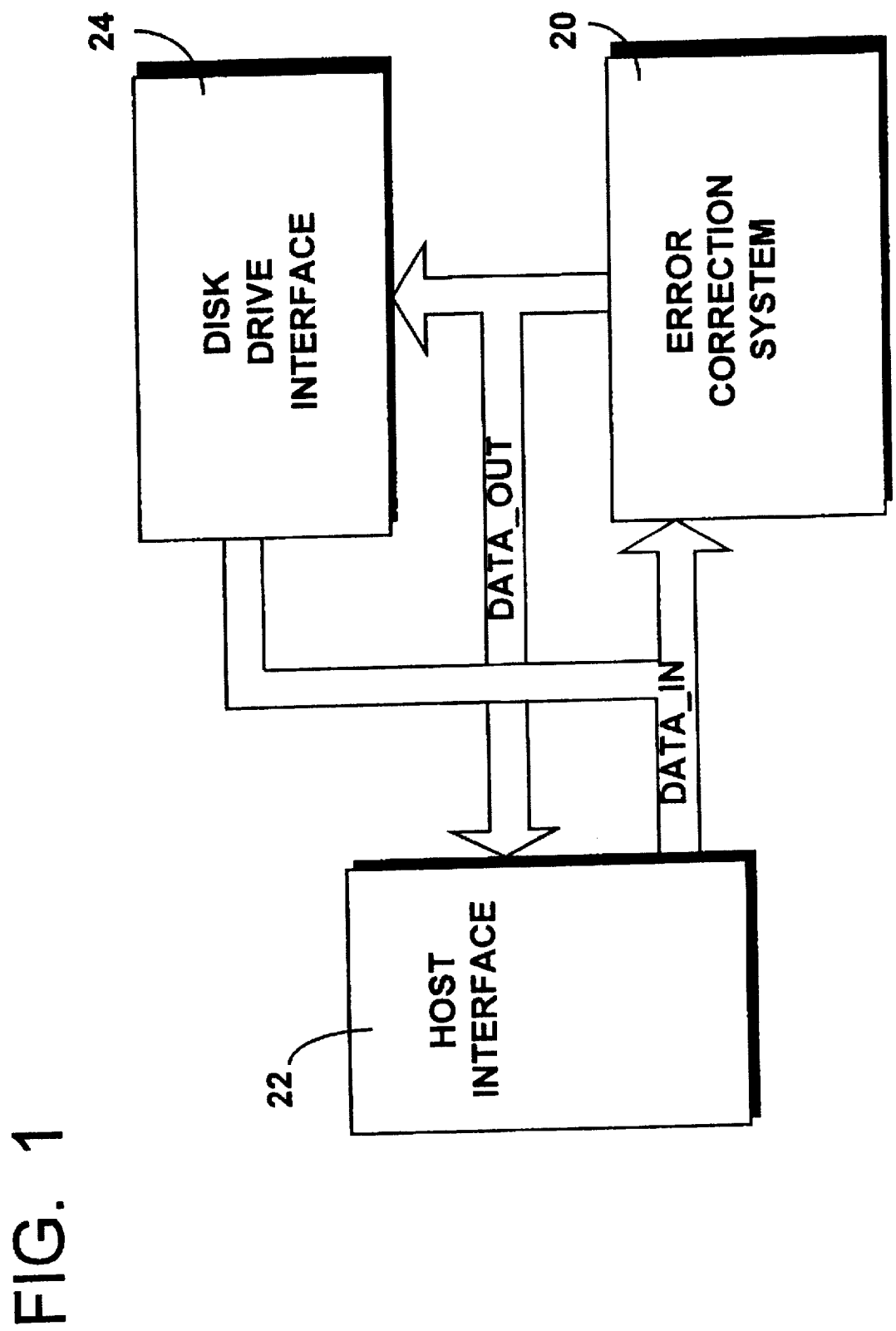
FIG. 1 is a schematic view showing connection of an error correction system of the invention to a host interface and a disk drive interface.

FIG. 1 shows an error correction system 20 of the present invention connected intermediate a host interface 22 and a disk drive interface 24. In the illustrated embodiment, disk drive interface 24 is part of a drive for a rotating magnetic medium. Error correction system 20 forms part of an overall disk drive controller which need not be illustrated for an understanding of the present invention. Although it is actually through the disk drive controller by which error correction system is connected to host interface 22 and disk drive interface 24, it suffices for the present invention to show error correction system 20 as receiving data to be encoded (from host interface 22) or a codeword to be decoded (from disk drive interface 24) on bus DATA_IN, and as outputting corrected data (to host interface 22) or an encoded codeword (to disk drive interface 24) on bus DATA_OUT.

Figure 2:
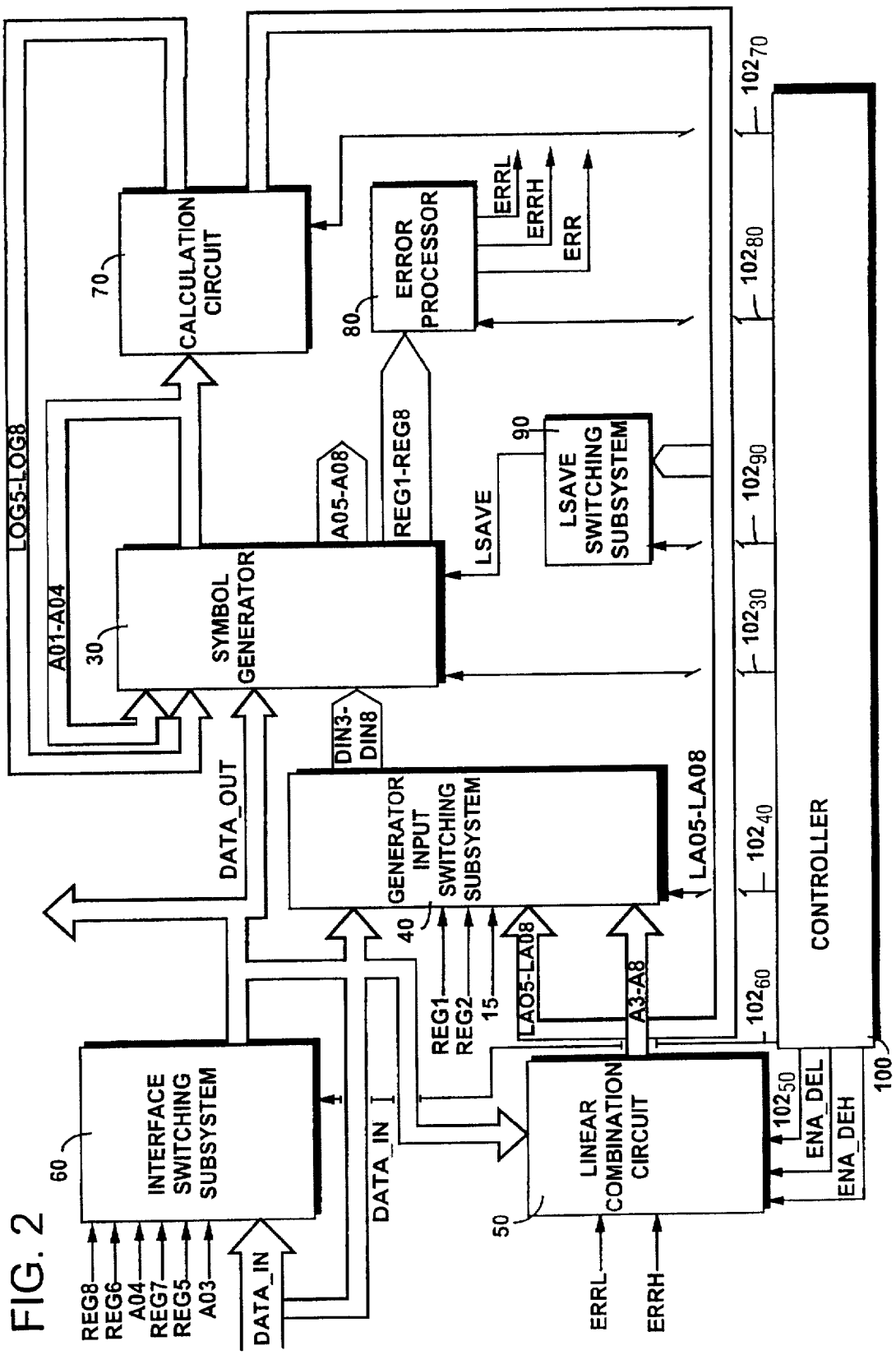
FIG. 2 is a schematic view of an error correction system according to an embodiment of the invention.

FIG. 2 shows components of error correction system 20, including symbol generator 30; generator input switching subsystem 40; linear combination circuit 50; interface switching subsystem 60; calculation circuit 70 (also known as a calculator); error processing circuit 80 (also known as an error pattern generator); LSAVE switching subsystem 90 (also known as an error address determinator); and, controller 100.

As explained in more detail below, error correction system 20 conducts both encoding, i.e. generating redundancy, and decoding, i.e. correcting errors and checking corrections. Error correction system 20 operates on an eight byte codeword comprising a predetermined number of data bytes, a predetermined number of CRC bytes, and two ECC bytes. For illustrative purposes, the number of data bytes is set at four and the number of CRC bytes is set at two. Each byte is treated as two symbols from GF(16), i.e. the finite field with four-bit elements. Two symbols are input with each clock, i.e. a byte at a time. The field generator is $G(X)=X^4+X+1$. The symbol $\alpha$, referred to below, is a root of $G(X)$ and has representation 0010.

INTERFACE SWITCHING SUBSYSTEM

Figure 4:
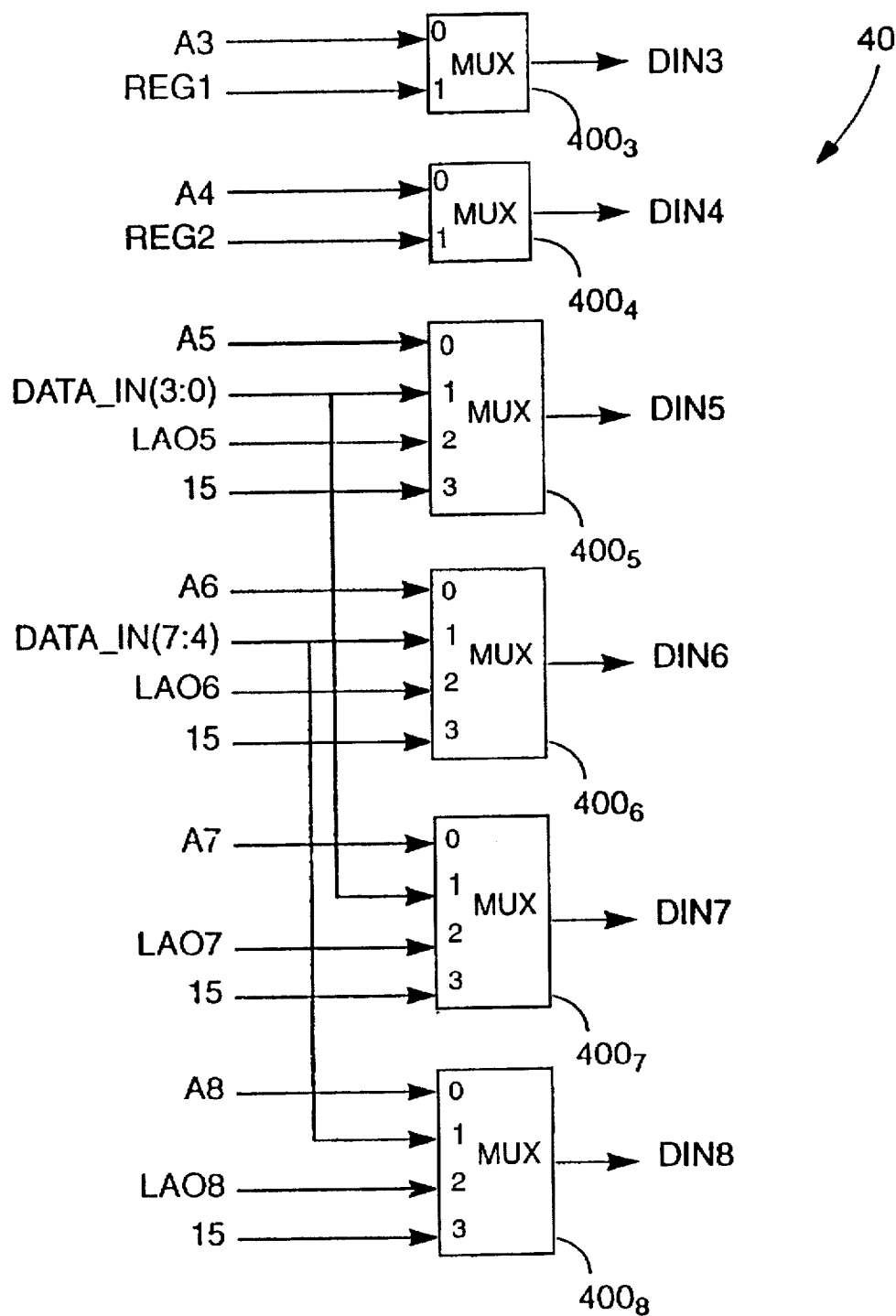
FIG. 4 is a schematic view of a generator input switching subsystem of the error correction system of FIG. 2.
Figure 6:
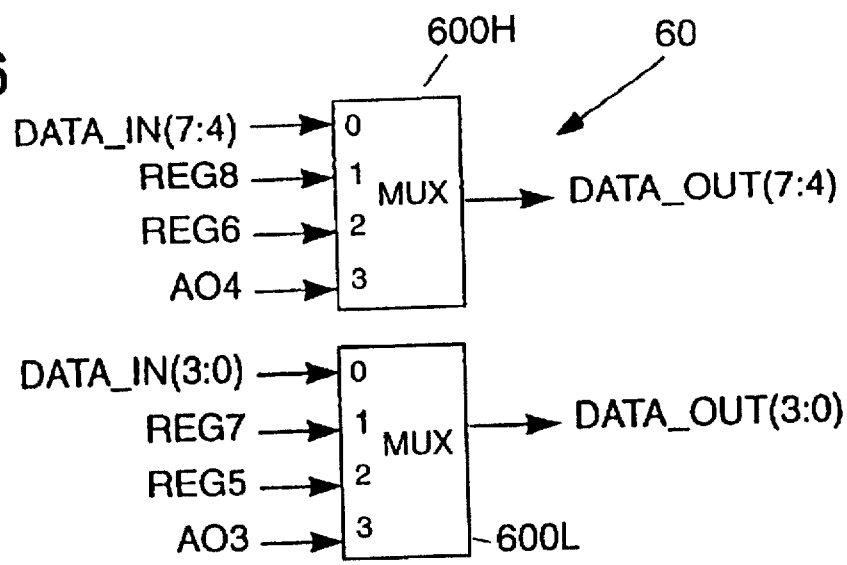
FIG. 6 is a schematic view of an interface switching subsystem of the error correction system of FIG. 2.

FIG. 6 shows that interface switching subsystem 60 as including two multiplexers 600L and 600H. Since error correction system 20 handles two symbols (i.e., one byte) at a time, MUX 600L receives a first symbol on the lower order bits of bus DATA_IN and MUX 600H receives a second symbol on the higher order bits of bus DATA_IN. Output terminals of MUXes 600L and 600H are connected to lower and higher order bits, respectively, of output bus DATA_OUT. As understood from other drawings including FIG. 2, bus DATA_OUT is connected not only to interfaces 22 and 24, but also to other constituent components of error correction system 20, including symbol generator 30 and linear combination circuit 50. Similarly, bus DATA_IN is connected to other components, including generator input switching subsystem 40 (see FIG. 4).

GENERATOR INPUT SWITCHING SUBSYSTEM

Generator input switching subsystem 40 includes a plurality of "DIN" multiplexers $400_3$–$400_8$. MUXes $400_5$ and $400_7$ have their "1" input terminals connected to receive the lower order bits (lower order symbol) carried on bus DATA_IN; MUXes $400_6$ and $400_8$ have their "1" input terminals connected to receive the higher order bits (higher order symbol) carried on bus DATA_OUT. Other input terminal connections of MUXes 400 will become apparent in the ensuing discussion. Output terminals DIN3–DIN8 of MUXes $400_3$–$400_8$, respectively, are connected to symbol generator 30 in the manner described below with respect to FIG. 3.

SYMBOL GENERATOR

Symbol generator 30 includes eight registers known as REG1–REG 8 or registers $300_1$–$300_8$ and an ECC generation unit 301. Input to registers REG3–REG8 is controlled by respective multiplexers $302_3$–$302_8$. Output terminals of registers $300_1$–$300_8$ are connected to first input terminals of corresponding adders $304_1$–$304_8$. In addition, output terminals of registers $300_1$–$300_8$ are connected to register output lines REG1–REG8, respectively.

Adder $304_1$ has a second input terminal connected to the lower order bits of bus DATA__OUT, so that a value P0 can be accumulated in register $300_1$. Similarly, adder $304_2$ has a second input terminal connected to the higher order bits of bus DATA__OUT, so that a value P1 can be accumulated in register $300_2$. In at least an encoding operation, the value P0 serves as an even interleave parity value and the value P1 serves as an odd interleave parity value.

Adders $304_3$–$304_8$ have second input terminals connected to lines DIN3–DIN8. In an encoding operation, lines DIN3–DIN8 carry, e.g., data symbol-derived linear combinations for use in generating the CRC symbols.

Output terminals of adders $304_1$–$304_8$ are connected to adder output lines denominated as lines A01–A08, respectively, which carry similarly denominated signals, e.g., to calculation circuit 70. In addition, output terminals of adders $304_1$ and $304_2$ are connected to input terminals of respective registers $300_1$ and $300_2$ while output terminals of adders $304_3$–$304_8$ are connected via feedback multipliers $306_3$–$306_8$, respectively, to "0" input terminals of respective MUXes $302_3$–$302_8$. (All multipliers illustrated herein are multipliers in GF(16)). MUXes $302_5$–$302_8$ have their "1" input terminals connected to lines LOG5, LOG6, LOG7, LOG8, respectively, from calculation circuit 70. MUX $302_3$ has its "1" input terminal connected by a line $E_0$ to an output terminal of ECC generation unit 301, and its "2" input terminal connected by line LSAVE to the output of LSAVE switching subsystem 90. MUX $302_4$ has its "1" input terminal connected by a line $E_1$ to an output terminal of ECC generation unit 301.

Figure 3:
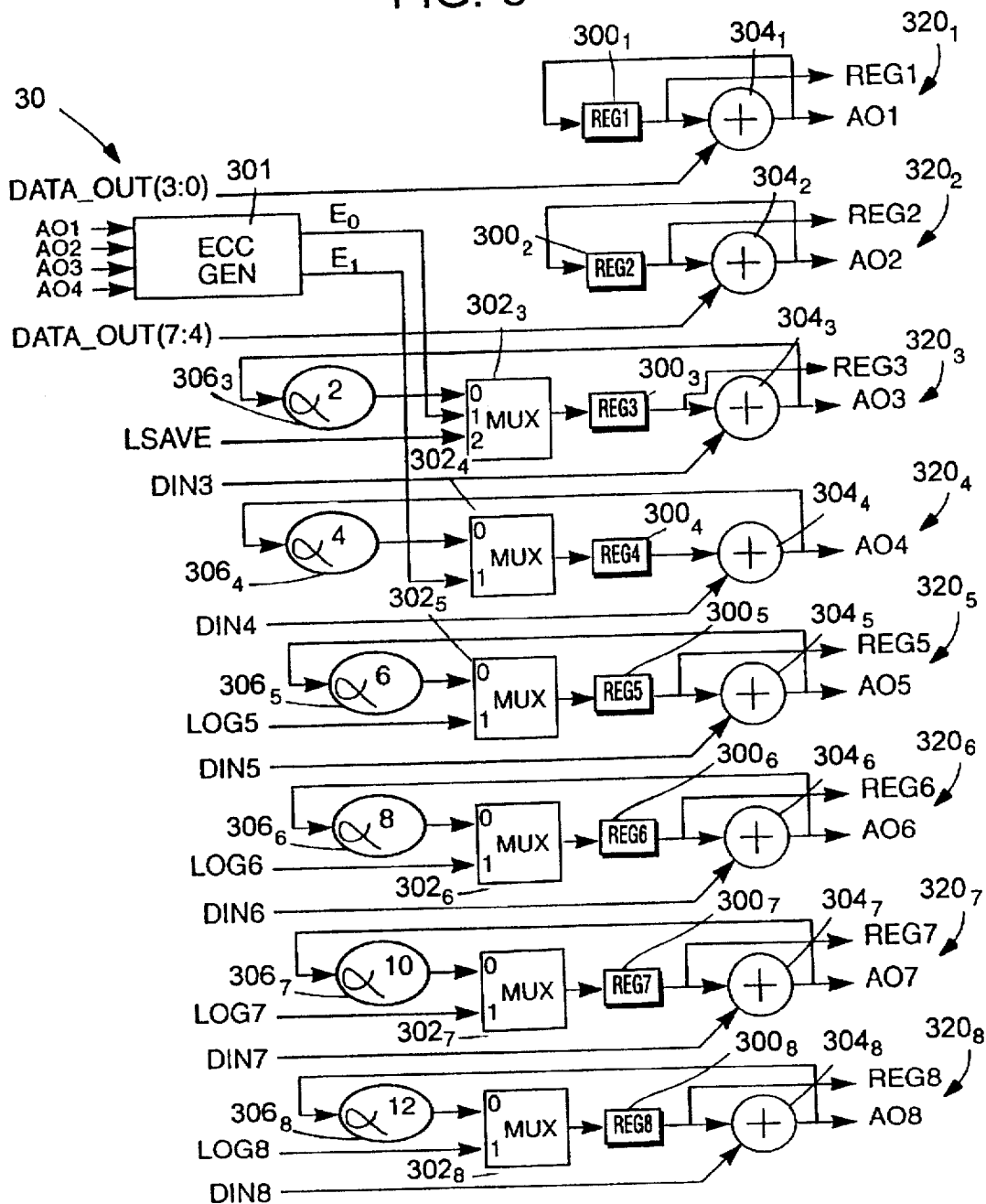
FIG. 3 is a schematic view of a symbol generator circuit according to an embodiment of the invention.

Symbol generator 30 can be conceptualized as comprising eight divider circuits $320_1$–$320_8$, with each divider including liked subscripted components in FIG. 3. As will eventually be seen, the divider circuits can be grouped into three sets—a first set $320_1$ and $320_2$; a second set $320_3$ and $320_4$; and a third set $320_5$–$320_8$.

As understood herein after, during an encoding operation the third set of dividers ($320_5$–$320_8$) is used to produce CRC symbols $CR_0$–$CR_3$, respectively; ECC generation unit 301 generates symbols $E_0$ and $E_1$; the first set of dividers ($320_1$ and $320_2$) is used to generate even and odd parity values P0 and P1, respectively; and, the second set of dividers ($320_3$ and $320_4$) is used to output symbols $E_0$ and $E_1$, respectively, as well as to generate symbols $E_2$ and $E_3$, respectively.

As understood hereinafter with respect to decoding and checking operations, the first set of dividers ($320_1$ and $320_2$) is used to generate even and odd parity values P0 and P1 (which also are error pattern bits); the second set of dividers ($320_3$ and $320_4$) is used to generate syndromes S1 and S2, as well as to store a reference address value (LSAVE); and the third set of dividers ($320_5$–$320_8$) is used for multitudinous purposes including generation of regenerated CRC values; addition of the regenerated CRC values to sequence-received CRC values; and generation of CRC check values, for example.

The divider circuits 320 divide the input data by factors of the form $X+\alpha^k$. Since two symbols are processed at a time, the feedback multiplier values for multipliers 306 are $\alpha^{2k}$ instead of $\alpha^k$. For example, the feedback multiplier value for multiplier $306_5$ associated with REG5 (i.e., register $300_5$) is $\alpha^6$ and the division factor is $X+\alpha^3$ which is used to generate $CR_0$.

ERROR PROCESSING CIRCUIT

Figure 8:
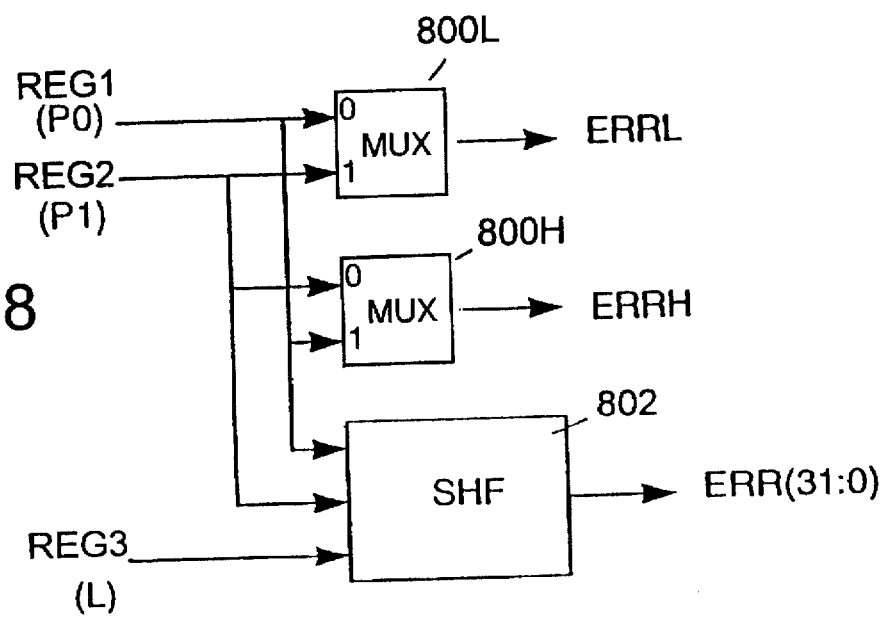
FIG. 8 is a schematic view of an error processing circuit of the error correction system of FIG. 2.

FIG. 8 shows error processing circuit 80 (error pattern generator) as including a lower order error multiplexer 800L and a higher order error multiplexer 800H, as well as an error pattern generator or SHF 802. Line REG1 (carrying e.g., an even interleave burst value "P0" from symbol generator 30) is connected to "0" and "1" input terminals of MUXes 800L and 800H, respectively, as well as to error pattern generator 802. Line REG2 (carrying e.g., an odd interleave burst value "P1" from symbol generator 30) is connected to "1" and "0" input terminals of MUXes 800L and 800H, respectively, as well as to error pattern generator 802. In addition to receiving signals carried on line REG1 and REG2, error pattern generator 802 is also connected to line REG3 (carrying e.g., a value "L" from symbol generator 30). An output terminal of MUX 800L is connected to a line ERRL for applying a similarly named signal to linear combination circuit 50. An output terminal of MUX 800H is connected to a line ERRH for applying a similarly named signal to linear combination circuit 50. A thirty-two bit output terminal of error shifter 802 is connected to an output ERR which carries a resultant error pattern.

LINEAR COMBINATION CIRCUIT

Linear combination circuit 50 includes input MUXes 500L and 500H, with MUX 500L being a lower order 4-bit input multiplexer and MUX 500H being a higher order 4-bit input multiplexer. In addition, linear combination circuit 50 includes adders $508_3$–$508_8$; multipliers $509_3$–$509_8$; control multiplexers $510_5$–$510_8$, and AND gates 512, 514.

MUX 500L receives the lower 4 order bits carried on bus DATA__OUT (from interface switching system 60) at its "0" input terminal and the signal ERRL (from error correction circuit 80) at its "1" input terminal. MUX 500H receives the higher 4 order bits carried on bus DATA__OUT (from interface switching system 60) at its "0" input terminal and the signal ERRH (from error correction circuit 80) at its "1" input terminal.

An output terminal of MUX 500L is ultimately connected to input terminals of multipliers $509_3$–$509_8$. While the output terminal of MUX 500L is connected directly to input terminals of multipliers $509_3$ and $509_4$, such output terminals are connected via MUX $510_8$ to multiplier $509_8$; via AND gate 512 and MUXes $210_5$–$210_7$ ("0" input pins), respectively, to multipliers $509_5$–$509_7$, respectively. Output terminals of multipliers $509_3$–$509_8$ are connected to first input terminals of adders $508_3$–$508_8$, respectively.

An output terminal of MUX 500H is ultimately connected to second input terminals of adders $508_3$–$508_8$, as well as input terminals to multipliers $509_5$–$509_8$. While the output terminal of MUX 500H is connected directly to input terminals of adders $508_3$ and $508_4$, such output terminals are connected via AND gate 514 second terminals of adders $508_5$–$508_8$. The output terminal of MUX 500H is connected via MUXes $510_5$–$510_8$ ("1" input pins) to input terminals of multipliers $509_5$–$509_8$, respectively.

In addition to having its first set of input terminals connected to the output terminals of MUX 500L, AND gate 512 has its second set of input terminals connected by line ENA__DEL to controller 100. Similarly, in addition to having its first set of input terminals connected to the output terminals of MUX 500H, AND gate 514 has its second set of input terminals connected by line ENA__DEH to controller 100.

Output terminals of adders $508_3$–$508_8$ are connected by lines A3–A8, respectively, to carry similarly named signals to generator input switching subsystem 40, and particularly to "0" input terminals of DIN MUXes $400_3$–$400_8$, respectively.

CALCULATION CIRCUIT

Figure 7:
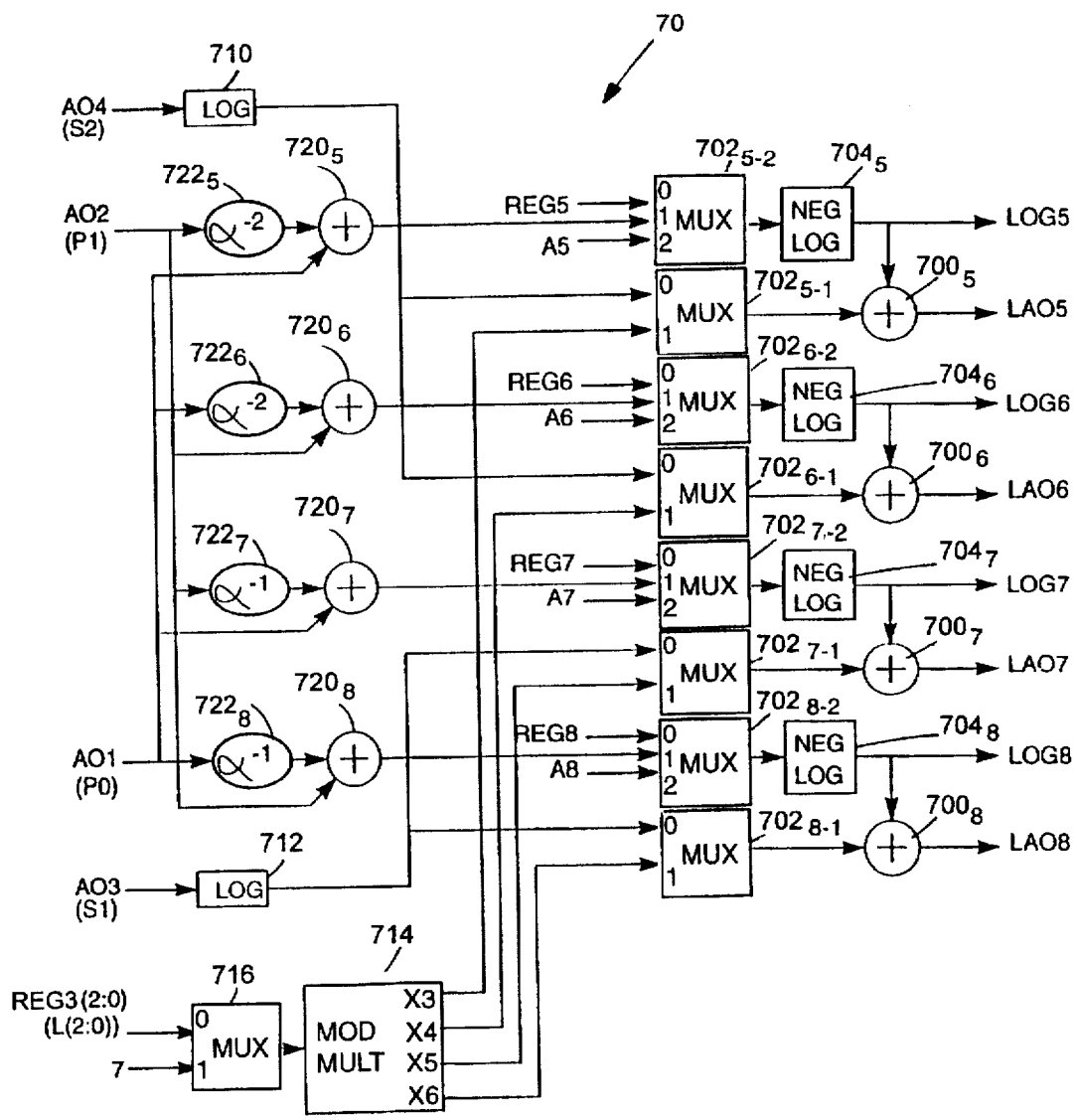
FIG. 7 is a schematic view of a calculation circuit of the error correction system of FIG. 2.

Calculation circuit 70, shown in FIG. 7, includes a plurality of adders $700_5$–$700_8$, whose output values are applied on lines $LAO_5$–$LAO_8$, respectively. Values to be applied to first input terminals of adders $700_5$–$700_8$ are gated by MUXes $702_{5-1}$–$702_{8-1}$; values to be applied to second input terminals of adders $700_5$–$700_8$ are gated by log input MUXes $702_{5-2}$–$702_{8-2}$. Values gated through log input MUXes $702_{5-2}$–$702_{8-2}$ are applied to negative log determination units $704_5$–$704_8$, respectively, with the outputs of negative log determination units $704_5$–$704_8$ being applied to the second input terminals of $700_5$–$700_8$ and on lines LOG5–LOG8, respectively, to symbol generator 30 (see FIG. 3).

Calculation circuit 70 further comprises two logarithmic determination units 710 and 712, as well as a modulo multiplier unit 714. Log determination unit 710 has its input terminal connected to line AO4 and its output terminal connected to the "0" input terminals of MUXes $702_{5-1}$ and $702_{6-1}$. Log determination unit 712 has its input terminal connected to line AO3 and its output terminal connected to the "0" input terminals of MUXes $702_{7-1}$ and $702_{8-1}$. Input to modulo multiplier unit 714 is gated by MUX 716, which selects between a constant value "7" at its "1" input terminal and the lower order two bits on line REG3 (i.e., the lower order two bits of the value "L") at its "0" input terminal. Output terminals $X_3$–$X_6$ of modulo multiplier unit 714 are connected to "1" input terminals of MUXes $702_{5-1}$–$702_{8-1}$, respectively.

Calculation circuit 70 further includes preparatory adders $720_5$–$720_8$ and multipliers $722_5$–$722_8$. The output terminals of adders $720_5$–$720_8$ are connected to "1" input terminals of respective log input MUXes $702_{5-2}$–$702_{8-2}$, respectively. Adders $720_5$ and $720_7$, and multipliers $722_6$ and $722_8$, have first input terminals connected to line AO1 (which carries the even interleave parity value P0). Second input terminals of adders $720_5$ and $720_7$ are connected to output terminals of multipliers $722_5$ and $722_7$, respectively. Adders $720_6$ and $720_8$, and multipliers $722_5$ and $722_7$, have first input terminals connected to line AO2 (which carries the odd interleave parity value P1). Second input terminals of adders $720_6$ and $720_8$ are connected to output terminals of multipliers $722_6$ and $722_8$, respectively.

Log input MUXes $702_{5-2}$–$702_{8-2}$ of calculation circuit 70 have their "0" input terminals connected to lines REG5–REG8, respectively.

TABLE 1 shows output values generated by log units 710 and 712 upon receipt of respective input values. Similarly, TABLE 2 shows output values generated by negative log determination circuits 704 upon receipt of respective input values, and TABLE 3 shows output values generated by modulo multiplication unit 714 upon receipt of respective input values. Given these tables, the man skilled in the art can build suitable circuitry for performing the functions of units 710, 712, 704, and 714.

LSAVE SWITCHING SUBSYSTEM

Figure 9:
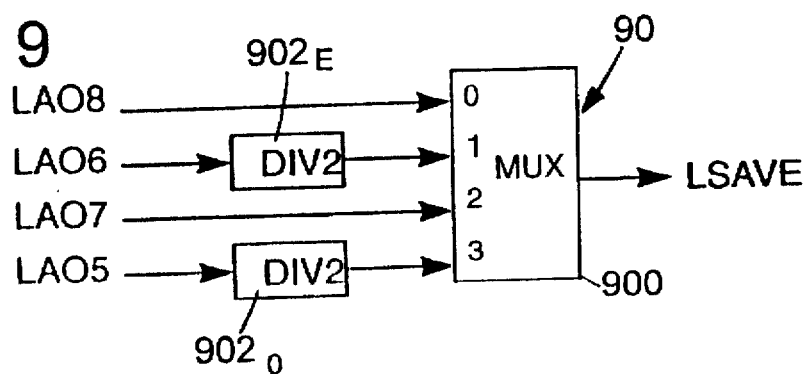
FIG. 9 is a schematic view of an LSAVE switching subsystem of the error correction system of FIG. 2.

LSAVE switching subsystem 90 in FIG. 9 (also known as the reference address determinator) includes a LSAVE MUX 900 and two dividers $902_E$ and $902_O$. Dividers 902 conduct a divide-by-2 operation and are modulo 15, meaning that the output bits of dividers 902 are just the input bits circularly shifted by one (bit 0 in the input becomes bit 3 in the output). Input terminal "0" of MUX 900 is connected to line LA08 (to receive a value LEVEN1); input terminal "1" of MUX 900 is connected to line LA06 via divider $902_E$ (to receive a value LEVEN2); input terminal "2" of MUX 900 is connected to line LA07 (to receive a value LODD1); input terminal "3" of MUX 900 is connected to line LA05 via divider $902_O$ (to receive a value LODD2). Output terminals of LSAVE MUX 900 is connected to line LSAVE which carries a similarly denominated signal to symbol generator 30.

CONTROLLER

Controller 100 supplies timing and control signals to each component of error correction system 20, including symbol generator 30; generator input switching subsystem 40; linear combination circuit 50; interface switching subsystem 60; calculation circuit 70; error processing circuit 80; and, LSAVE switching subsystem 90. These timing and control signals are applied on buses 102 which are subscripted in FIG. 2 in accordance with the component to which the bus is connected. Among the signals supplied are select signals for the various multiplexers comprising these components, as well as signals such as ENA_DEL and ENA_DEH as hereinafter described. The operation of controller 100 will be understood in connection with the ensuing discussion of encoding and decoding operations.

OPERATION

For both encoding and decoding, error correction system 20 utilizes a particular codeword, C(x). Codeword C(x) consists of data symbols, CRC symbols and ECC symbols and is defined by Equation 1.

$$C(x) = \sum_{n=0}^{7} D_n X^{n+8} + \sum_{n=0}^{3} CR_n X^{n+4} + \sum_{n=0}^{3} E_n X^n \quad \text{Equation (1)}$$

In Equation 1, $D_n$ are the data symbols, $CR_n$ are the CRC symbols, and $E_n$ are the ECC symbols. The codeword C(x) thus consists of eight data symbols, i.e. four data bytes followed by four CRC symbols, i.e. two CRC bytes followed by four ECC symbols, i.e. two ECC bytes. The CRC symbols are defined by Equation 2:

$$CR_k = \sum_{n=0}^{7} D_n X^{n+1} mod(X + \alpha^{3+k}) \quad \text{EQUATION (2)}$$

for k=0 to 3. As will be seen in more detail below, the CRC symbols are only generated over the data symbols. The $E_2$ and $E_3$ symbols are parity symbols over the entire codeword C(X) divided into two interleaves and are generated such that:

$$\sum_{n=0}^{7} C_{2n+k} = 0 \quad \text{EQUATION (3)}$$

for k=0, 1 where $C_j$ is the coefficient of the $X_j$ term in C(X) in Equation 1. Equation 3 states that both even and odd codeword interleaves have even parity. An equivalent statement is that $E_3$ is the accumulated parity, i.e. sum, of all the other codeword symbols in the even interleave and $E_2$ is the accumulated parity of all the other codeword symbols in the odd interleave. $E_0$ and $E_1$ are defined by:

$$E_1 X + E_0 = \sum_{n=2}^{15} C_n X^n mod(X + \alpha^2)(X + \alpha^1) \quad \text{EQUATION (4)}$$

Equation 4 states that the codeword polynomial, C(X), has $\alpha^2$ and $\alpha^1$ as roots.

ENCODING OPERATION

FIG. 10 shows general steps executed in connection with encoding of a codeword by error correction system 20. Operation of error correction system is timed relative to clock cycles. As indicated in FIG. 10, the encoding operation occurs in three phases, the three phases collectively totalling eight encoding clock cycles per codeword.

Encoding phase one includes steps 1002 and 1004 (which are both executed during the first four clock cycles per codeword). During step 1002, eight data symbols received from host interface 22 on bus DATA_IN are transmitted (two symbols per clock cycle) through interface switching subsystem 60 (see FIG. 6) and onto bus DATA_OUT for application to disk drive interface 24. During step 1004, the data symbols are also applied to symbol generator 30 for two purposes. A first purpose is for ultimate generation of even and odd interleave parity values P0 and P1 in registers $300_1$ and $300_2$, respectively, and for calculating the remainders $D(X) \bmod(x+\alpha)$ and $D(X) \bmod(x+\alpha^2)$ by dividers $320_3$ and $320_4$, respectively. A second purpose is for generation of CRC symbols $CR_0$, $CR_1$, $CR_2$, and $CR_3$ by dividers $320_5$–$320_8$, respectively.

Encoding phase two includes step 1006 (executed in the fifth encoding clock cycle) and step 1008 (executed in the sixth encoding clock cycle). In step 1006, symbols $CR_3$ and $CR_2$, having been generated in step 1004, are gated back to interface switching subsystem 60 and applied on bus DATA_OUT to disk drive interface 24. At step 1008, during the sixth encoding clock cycle, symbols $CR_1$ and $CR_0$ are gated back to interface switching subsystem 60 and error correction symbols $E_1$ and $E_0$ are generated by symbol generator 30, particularly by ECC GEN unit 301.

Encoding phase three includes steps 1010, 1012, and 1014. Steps 1010 and 1012 are executed during the seventh encoding clock cycle; step 1014 is executed during the eighth encoding clock cycle. During step 1010, error correction symbols $E_3$ and $E_2$ are generated by symbol generator 30. At step 1012, error correction symbols $E_3$ and $E_2$, having been generated at step 1010, are routed back to interface switching subsystem 60 for application on bus DATA_OUT to disk drive interface 24. During step 1014, error correction symbols $E_1$ and $E_0$, having been generated at step 1008, are outputted via interface switching subsystem 60 and bus DATA_OUT to disk drive interface 24.

FIG. 10 thus summarizes encoding of a codeword, including generation of CRC symbols $CR_3$, $CR_2$, $CR_1$, $CR_0$, and error correction symbols $E_3$, $E_2$, $E_1$, $E_0$, which are output in that order (after the data symbols) to disk drive interface 24. Steps of FIG. 10 are described in more detail below in context of the functioning of the various components of error correction system 20.

During the first encoding four clocks (clocks 1 to 4), and as part of step 1002, controller 100 issues select signals to cause MUXes 600H and 600L to route the data symbols applied on bus DATA_IN to bus DATA_OUT. As indicated above, two data symbols are applied on each encoding clock cycle, i.e., data symbols $D_7$ and $D_6$ on the first encoding clock cycle; data symbols $D_5$ and $D_4$ on the second encoding clock cycle; and so forth until data symbols $D_1$ and $D_0$ are applied on the fourth encoding clock cycle.

The data symbols are also applied on bus DATA_OUT to parity-forming dividers $320_1$ and $320_2$ of symbol generator 30. In particular, the higher order bits of bus DATA_OUT are applied to adder $304_2$ of divider $320_2$; the lower order bits of bus DATA_OUT are applied to adder $304_1$ of divider $320_1$. The dividers $320_1$ and $320_2$ are used to generate the parity values P0 and P1 over the data symbols and the CRC symbols.

Since bus DATA_OUT is also applied to linear combination circuit 50 (see FIG. 5), the data symbols are also used, e.g., at step 1004, in linear combinations which are input to symbol generator 30 for use in generating the CRC symbols $CR_3$–$CR_0$. In particular, linear combinations formed by circuit 50 are outputted on lines A3–A8 to generator input switching subsystem 40 (see FIG. 4), which in turn outputs the data symbol-based linear combination values on lines DIN3–DIN8, respectively, to symbol generator 30. As hereinafter described, symbol generator 30 is clocked with feedback during the four encoding clock cycles of step 1004, resulting in the formation of CRC symbols $CR_0$–$CR_3$ by dividers $320_5$–$320_8$, respectively, and the formation of the two other remainders by dividers $320_3$ and $320_4$.

Figure 5:
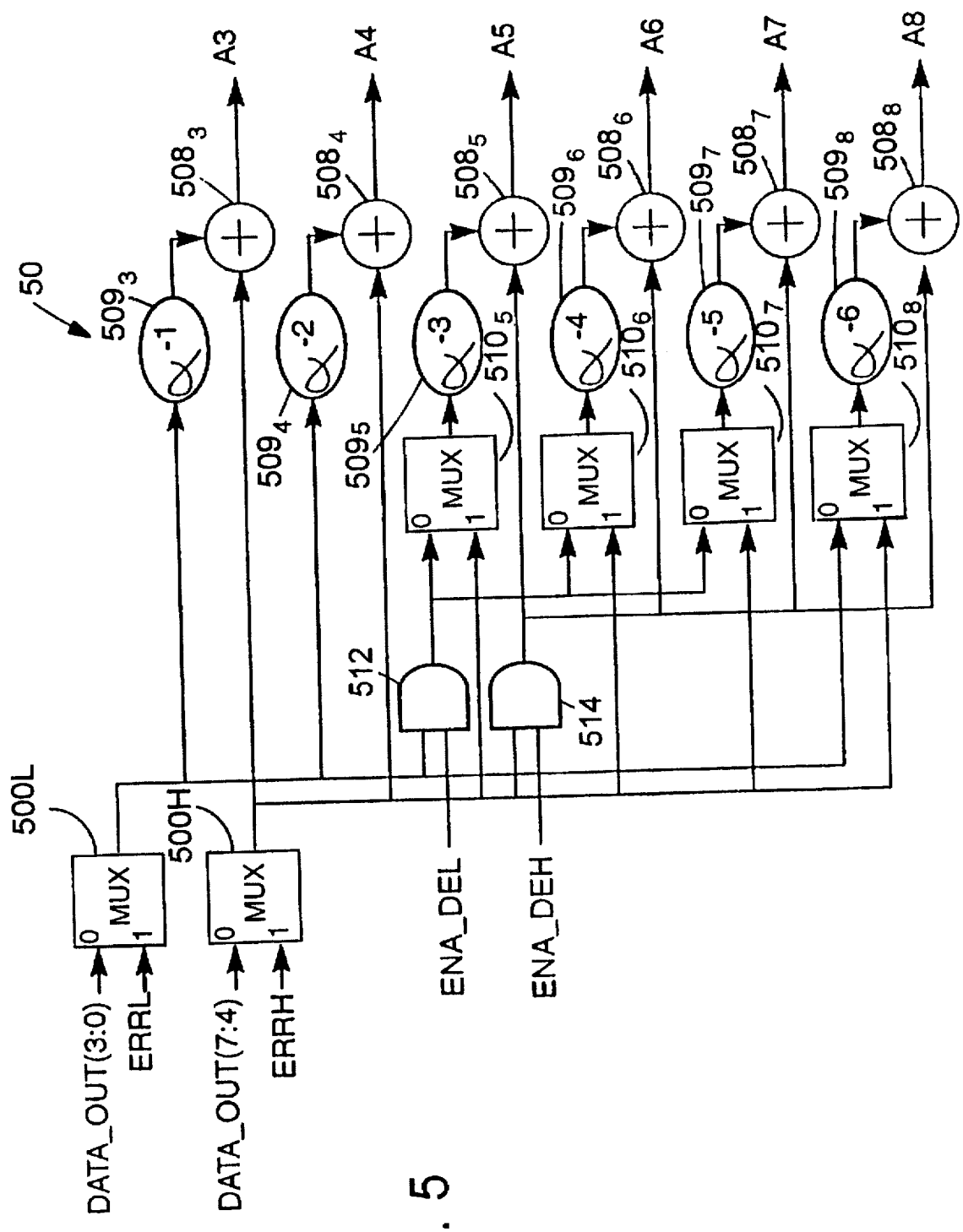
FIG. 5 is a schematic view of a linear combination circuit of the error correction system of FIG. 2.

Returning to linear combination circuit 50 as shown in FIG. 5, during step 1004, controller 100 causes MUXes 500L and 500H to select the data symbols carried on bus DATA_OUT for application to adders 508 and feedback multipliers 509 of circuit 50. Gates 512 and 514 are active, as controller 100 also sets the values on lines ENA_DEL and ENA_DEH to a high ("1") state. Controller 100 causes muxes 510 to select their "0" input terminals. Circuit 50 thereby generates linear combinations, which are necessary for inputting two symbols (i.e., two four-bit nibbles) on each clock to symbol generator 30. The linear combinations are outputted on lines A3–A8 to the DIN multiplexers 400 of generator input switching subsystem 40. Values for the linear combinations are understood with reference to FIG. 5. For example, the linear combination value outputted on line A8 (which is later applied on line DIN8 to symbol generator 30) is $DH + DL\alpha^{-6}$, where DH is DATA_OUT (7:4) and DL is DATA_OUT (3:0).

During step 1004, controller 100 issues select signals to DIN MUXes 400 whereby MUXes 400 gate therethrough the data symbol-derived linear combination signals received from circuit 50 on line A3–A8, so that the linear combination signals are applied on lines DIN3–DIN8, respectively, to symbol generator 30.

In step 1004, in symbol generator 30 the data symbol-derived linear combined signals on lines DIN3–DIN8 are applied to terminals of adders $304_3$–$304_8$, respectively. Moreover, as part of step 1004, controller 100 issues signals to cause MUXes 302 in symbol generator 30 (see FIG. 3) to select input at their "0" terminals and thereby transmit outputs of the respective feedback multipliers 306 to the inputs of respective registers 300. Thereby, during the second through the fourth encoding clock cycle, registers $300_1$–$300_8$ are clocked with feedback. As mentioned above, the divider circuits of symbol generator 30 which divide the input data by factors of the form $X+\alpha^k$, a reason being that since two symbols are processed at a time, the feedback multiplier values for multipliers 306 are $\alpha^{2k}$ instead of $\alpha^k$.

After execution of the first four encoding cycles of a codeword, step 1004 is complete and the values of CRC symbols $CR_0$–$CR_3$ reside in registers $300_5$–$300_8$, respectively.

At steps 1006 and 1008, i.e., during the fifth and sixth encoding clock cycle of a codeword, CRC symbols CR0 $CR_0$–$CR_3$ are gated out of registers $300_5$–$300_8$, through interface switching subsystem 60, and via bus DATA_OUT to disk drive interface 24. The CRC symbols are sequentially gated out at the rate of two per clock cycle. In addition to being clocked onto bus DATA_OUT, the CRC symbols are also clocked into dividers $320_1$–$320_4$, so that the CRC symbols can also be considered in connection with generation of the even and odd interleave parity values P0 and P1, and the two other remainders.

The clocking out of CRC symbols $CR_0$–$CR_3$ will now be described in more detail. On encoding clock cycle 5, MUXes 600H and 600L of interface switching subsystem 60 (see FIG. 6) select lines REG8 and REG7 to receive CRC symbols $CR_3$ and $CR_2$, respectively. Meanwhile, during encoding clock cycle 5, the contents of registers $300_6$ (REG6) and $300_5$ (REG5) are not allowed to change. Then, on encoding clock cycle 6, MUXes 600H and 600L select lines REG6 and REG5, respectively, to receive CRC symbols $CR_1$ and $CR_0$, respectively.

Since bus DATA_OUT also feeds linear combination circuit 50 in the manner aforedescribed, the CRC symbols $CR_3$, $CR_2$, $CR_1$, and $CR_0$ are, during the fifth and sixth encoding clock cycles, applied to linear combination circuit 50, whereupon the resulting CRC symbol-derived linear combinations are applied on lines A3 and A4 and lines DIN3 and DIN4 to calculation circuit 30. As a result, the CRC symbol-derived linear combinations are clocked into dividers $320_1$–$320_4$.

Upon completion of step 1008, final determination of the error correction parity byte (i.e symbols $E_3$ and $E_2$), which are the two parity nibbles generated over the even and odd nibble interleaves, cannot yet be made since the last two ECC symbols, i.e. symbols $E_1$ and $E_0$, have not yet been generated. Therefore after the CRC bytes have been output, the $E_1$ and $E_0$ symbols must be available for use in finally accumulating symbols $E_3$ and $E_2$, and then for subsequent output to disk drive interface 24.

Symbols $E_1$ and $E_0$ are generated in the manner now described. Let D(X) be the polynomial formed by the sequence of data and CRC symbols, i.e $$D(X) = \sum_{n=4}^{15} C_n X^{n-4} \quad \text{EQUATION (5)}$$

Further, let P0 and P1 be the parity over the even and odd nibble interleaves of this sequence. Then define G1 and G2 as:

$$G1 = (D(X)X + P1 + P0X^{-1}) \mod(X+\alpha^1) = D(\alpha)\alpha + P1 + P0\alpha^{-1}$$

$$G2 = (D(X)X + P1 + P0\ X^{-1}) \mod(X+\alpha^2) = D(\alpha^2)\alpha^2 + P1 + P0\alpha^{-2}$$

At the time that the last CRC byte is being output, i.e., during the sixth encoding clock cycle, output values from symbol generator 30 are as follows (see FIG. 3):

AO3 is $D(\alpha)\alpha^{-1}$
AO4 is $D(\alpha^2)\alpha^{-2}$
AO1 is P0
AO2 is P1.

Therefore:

$$G1 = AO3\alpha^2 + AO2 + AO1\alpha^{-1}$$

$$G2 = AO4\alpha^4 + AO2 + AO1\alpha^{-2}$$

At this point, $$C_2 = E_2 = P0 + E_0$$

and $$C_3 = E_3 = P1 + E_1.$$

Then, substituting into Equation 4:

$$\begin{aligned}E_1X + E_0 &= (D(X)X^4 + C_3X^3 + C_2X^2) \mod (X+\alpha^2)(X+\alpha^1) \\ &= (D(x)X^4 + (P1+E_1)X^3 + \\ &\quad (P0+E_0)X^2) \mod (X+\alpha^2)(X+\alpha^1)\end{aligned}$$

Therefore:

$$(E_1X+E_0)\mod(X+\alpha) = (D(X) X^4 + (P1+E_1)X^3 + (P0+E_0)X^2)\mod(X+\alpha)$$

and $$(E_1X+E_0)\mod(X+\alpha^2) = D(X)X^4 + (P1+E_1)X^3 + (P0+E_0)X^2)\mod(X+\alpha^2)$$

which yield:

$$E_1\alpha + E_0 = D(\alpha)\alpha^4 + (P1+E_1)\alpha^3 + (P0+E_0)\alpha^2$$

and $$E_1\alpha^2 + E_0 = D(\alpha^2)\alpha^8 + (P1+E_1)\alpha^6 + (P0+E_0)\alpha^4$$

which yield:

$$E_1\alpha + E_0 = G1\ \alpha^3 + E_1\alpha^3 + E_0\alpha^2$$

and $$E_1\alpha^2 + E_0 = G2\alpha^6 + E_1\alpha^6 + E_0\alpha^4$$

Solving for $E_0$ and $E_1$ yields:

$$E_0 = G1\alpha^7 + G2\alpha^1$$

$$E_1 = G1\alpha^5 + G2.$$

Substituting for G1 and G2 (from the foregoing expressions) yields:

$$E_0 = AO4\alpha^5 + AO3\alpha^9 + AO2(\alpha^7+\alpha^1) + AO1(\alpha^6+\alpha^{-1})$$

$$E_1 = AO4\alpha^4 + AO3\alpha^7 + AO2(\alpha^5+\alpha^0) + AO1(\alpha^4+\alpha^{-2}).$$

As explained below, it is precisely these values for $E_0$ and $E_1$ which are calculated by the ECC GEN unit 301 in symbol generator 30 (see FIG. 3) during encoding clock cycle 6 at step 1008. In this regard, note that ECC GEN unit 301 is connected to receive signal lines AO1, AO2, AO3, and AO4 as inputs from adders $304_1$–$304_4$, respectively.

When the last CRC byte is being output (encoding clock cycle 6), $E_0$ and $E_1$ are clocked from ECC GEN unit 301 into registers $300_3$ and $300_4$ (i.e., REG3 and REG4), respectively, via respective MUXes $302_3$ and $302_4$. On the next clock cycle, i.e., encoding clock cycle 7, as reflected by step 1010 in FIG. 10, $E_2$ is obtained according to the expression $$E_2 = P0 + E_0$$

by adding the contents of register $300_1$ (REG1), i.e. P0, to the contents of register $300_3$ (REG3), i.e. $E_0$. This addition is facilitated as controller 100 issues a select signal to DIN3 MUX $400_3$ (see FIG. 4.) to gate the contents of REG1 to adder $304_3$ (see FIG. 3), whereupon adder $304_3$ adds the value on DIN3 (i.e., P0) to the contents of register REG3 (i.e., $E_0$). Similarly, at step 1010, symbol generator 30 forms $E_3$ according to the expression:

$$E_3 = P1 + E_1$$

by adding the contents of register $300_2$, i.e. P1, to the contents of register $300_4$, i.e. $E_1$. This addition by adder $304_4$ is facilitated by mux $400_4$ in like manner as described above.

During step 1012, during the seventh encoding clock cycle, symbols $E_3$ and $E_2$ are output (via respective lines AO3, AO4 and interface switching subsystem 60) onto bus DATA__OUT in similar manner as aforedescribed for other symbols. Then, on the next clock, i.e., the eighth and last encoding clock cycle, the $E_1$ and $E_0$ symbols in REG4 and REG3, respectively, are outputted in similar manner to bus DATA__OUT, by forcing DIN4 and DIN3 to zero, which places the contents of REG4 and REG3 on AO4 and AO3, respectively. DIN4 and DIN3 can be forced to zero by clearing REG2 and REG1 and gating them onto DIN4 and DIN3 by muxes $400_4$ and $400_3$.

It should be noted that encoding by error correction system 20 of the present invention does not have to be done one byte at a time. The illustrated example utilizes processing of one byte at a time as a convenience for a byte oriented system. Processing can also be accomplished one symbol at a time by bypassing the linear combination circuit 50 of FIG. 5; feeding values on bus DATA__OUT directly into the "0" inputs of DIN MUXes 400 of generator input switching subsystem 40; and by changing the values of feedback multipliers 306 in symbol generator 30 from $\alpha^{2k}$ to $\alpha^k$. Also, for processing one symbol at a time, REG1 (i.e., register $300_1$) would only clock in even interleave symbols and REG2 (i.e., register $300_2$) would only clock in odd interleave symbols.

DECODING/CORRECTION OPERATION

During a read operation from disk drive interface 24, potentially corrupted codewords in the form of symbol sequences are transmitted on bus DATA__IN from disk drive to error correction system 20. The code employed by error correction system 20 is capable of correcting any 2-nibble burst, i.e., is capable of correcting a byte burst. The symbols of the received sequence are acquired during reading in the order $D_7, D_6, \ldots D_0, CR_3, CR_2, \ldots CR_0, E_3, E_2, E_1, E_0$, i.e., data bytes followed by CRC bytes followed by error correction bytes. The symbols are acquired at the rate of two symbols of the sequence per decoding clock cycle. After the last sequence byte is clocked into error correction system 20 during the decoding operation, during the very next clock cycle (i.e., ninth clock cycle in the illustrated embodiment), a resultant four byte error pattern value is applied on line ERR (see FIG. 8 and FIG. 1). The error pattern value contains the portion of a burst which occurred in data. Thus, this four byte error pattern is output in the clock cycle immediately following reception of all eight bytes of the received sequence (eight bytes of two nibbles [i.e., two symbols] each). All four bytes of data are thus corrected at once.

In one embodiment, the sequences are headers, e.g., identification information, for sectors which are stored on or retrieved from a rotating magnetic recording medium (disk drive). It should thus be understood that error correction system can function as a header subsystem in the context of the error correction system disclosed in U.S. patent application Ser. No. 08/326,126, filed Oct. 18, 1994, entitled "ERROR CORRECTION METHOD AND APPARATUS", which is incorporated herein by reference.

Figure 11:
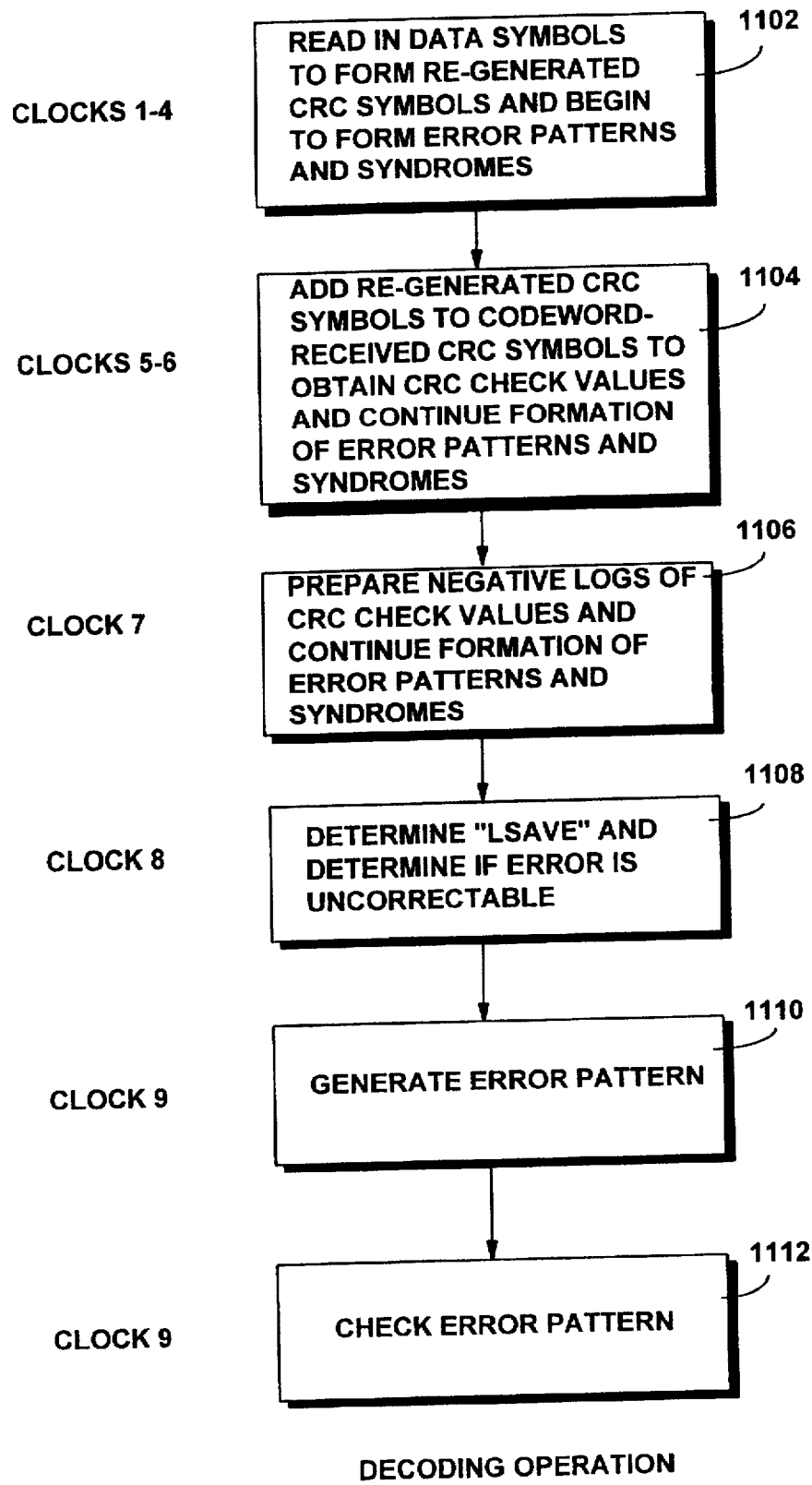
FIG. 11 is a flowchart showing general steps executed in a decoding/correction operation.

FIG. 11 shows general steps executed during the decoding/correction operation. At step 1102, data symbols $D_n$ are read in, two symbols per clock. Thus step 1102 lasts for four decoding clock cycles. During the acquisition of data symbols at step 1102, the data symbols are ultimately applied (in like manner with step 1004 of FIG. 10) to symbol generator 30 so that four regenerated CRC symbols $RCR_n$ can be formed by dividers $320_5-320_8$ and so that the even and odd interleave parity values P0 and P1 can begin tabulation in registers $300_1$ and $300_2$, respectively, and syndromes can begin formation in registers $300_3$ and $300_4$.

In connection with step 1102, the in-coming data symbols are applied to linear combination circuit 50 to form data symbol-derived linear combinations. These data symbol-derived linear combinations are applied on lines A3–A8 and through generator input switching subsystem 40 onto lines DIN3–DIN8, respectively, for application to dividers $320_3-320_8$, in like manner as discussed with respect to step 1004. Accordingly, upon completion of the first four decoding clock cycles, the regenerated CRC values, i.e., $RCR_3$, $RCR_2$, $RCR_1$, and $RCR_0$, are carried by lines AO5–AO8, respectively.

In step 1102 the in-coming data lower order bits and higher order bits on data bus DATA__IN are also routed through interface switching subsystem 60 and onto bus DATA__OUT for application to adders $304_1$ and $304_2$, respectively, as previously described, for tabulation of the parity values P0 and P1, respectively, and to adders $302_3$ and $302_4$ for formation of syndromes.

At step 1104, the regenerated CRC values, i.e., $RCR_3$, $RCR_2$, $RCR_1$, and $RCR_0$, which are stored in registers $300_8-300_5$, respectively, are added (XORed) to the codeword-received CRC symbols $CR_3-CR_0$ which are obtained during the fifth and sixth decoding clock cycles. The addition results, known as CRC check values or CRC check nibbles, then reside in registers $300_5-300_8$.

Adding of the regenerated CRC values ($RCR_3-RCR_0$) and the codeword-received CRC symbols ($CR_3-CR_0$) at step 1104 is facilitated by controller 100 issuing signals during clock 5 to cause DIN MUXes $400_7$ and $400_8$ to select their "1" input pin. Upon such selection, the CRC symbols being acquired on bus DATA__IN are routed through generator input switching subsystem 40 (see FIG. 4). Such routing allows the first two received CRC symbols (e.g., $CR_3$ and $CR_2$) to be added (XORed) with the first two regenerated CRC symbols (i.e., $RCR_3$ and $RCR_2$) stored in registers $300_8$ and $300_7$, respectively. Addition is accomplished by adders $304_8$ and $304_7$. The addition results are multiplied by feedback multipliers $306_8$ and $306_7$, respectively, and then put back into registers $300_8$ and $300_7$, respectively, which then contain two CRC check values. These check values are then available on lines REG6 and REG5. Registers $300_5$, $300_6$ are not allowed to change during clock 5.

On decoding clock cycle 6, controller 100 issues signals to cause DIN MUXes $400_6$ and $400_5$ to select their "1" input pins so that the third and fourth codeword-receivedCRC symbols (e.g., symbols $CR_1$ and $CR_0$) are routed to adders $304_6$ and $304_5$, respectively. During decoding clock 6, CRC symbols $CR_1$ and $CR_0$ are added to the regenerated CRC symbols $RCR_1$ and $RCR_0$ stored in registers $300_6$ and $300_5$, respectively. In like manner with clock cycle 5, the addition results are multiplied by feedback multipliers $306_6$ and $306_5$, respectively, and the multiplied results stored in registers $300_6$ and $300_5$ as two CRC check values. These CRC check values are then available on lines REG6 and REG5. Registers $300_8$, $300_7$ are not allowed to change during clock 6.

In step 1106, which occurs in decoding clock 7, the negative logs of all four CRC checks (i.e., CRC check values) are loaded into registers $300_5-300_8$. Preparation of the negative logs of the four CRC check values is now described. In step 1106, controller 100 issues signals commanding MUXes $302_5-302_8$ of symbol generator 30 to select their "log" input terminals (i.e., pins "1"). In addition, controller 100 issues signals commanding log input MUXes $702_{5-2}$–$702_{8-2}$ of calculation circuit 70 (see FIG. 7) to select their "0" inputs (e.g., the signals applied on lines REG5–REG8, respectively). By so doing, the CRC check values in registers $300_5$–$300_8$ are applied through MUXes $702_{5-2}$–$702_{8-2}$ to the respective negative log determination units $704_5$–$704_8$.

In general, negative log determination units $704_5$–$704_8$ function to receive an input value X and output a value Y, in accordance with either Equation 6 or Equation 7, as appropriate. Values outputted by negative log determination units 704 are also understood by reference to Table 2.

$$Y=(15-\log_\alpha(X)) \bmod 15 \qquad \text{EQUATION 6}$$

if X is not zero.

$$Y=15 \qquad \text{EQUATION 7}$$

if X is zero.

In the ensuing decoding clock cycle (e.g., clock 8), the values in registers $300_5$–$300_8$ are not changed.

It should be kept in mind that the CRC check values obtained in step 1104, and whose negative logarithm is stored in registers $300_5$–$300_8$ in step 1106, are formed by taking into consideration only errors that occur in the data symbols $D_n$ and/or the received CRC symbols $CR_n$. Yet to be finally determined are syndromes which cover the entire codeword.

As mentioned above, beginning with the first decoding clock cycle, in-coming data symbols are applied to symbol generator 30 for beginning the tabulation of even interleave and odd interleave parity values P0 and P1, respectively. Such tabulation is facilitated by controller 100 issuing select signals in clocks one through eight to command MUXes 600H and 600L of interface switching subsystem 60 (see FIG. 6) to select bus DATA_IN for all first eight decoding clock cycles.

At the end of the first eight decoding clock cycles, the values stored in registers $300_1$ and $300_2$, i.e., the values P0 and P1, are parity checks. Moreover, the value P0 also forms error pattern bits in the even address of an error burst and P1 also forms error pattern bits in the odd address of an error burst.

As used herein, the first symbol is address 15. Moreover, the start of a burst, as referenced herein, is the part of the burst with the lowest address, i.e. the second nibble of a 2-nibble burst.

With the foregoing addressing conventions in mind, let "L" be a reference address of a burst, and in particular the location (address) of the start of a burst. At step 1108, and during the eighth decoding clock cycle, error correction system 20 determines the value for "L", also known as "LSAVE", and stores LSAVE in register $300_3$ of calculation circuit 30.

The determination of LSAVE is now described in more detail. Let R(X) be the received sequence (i.e., the sixteen symbols received from disk drive interface 24). At the time that the last codeword byte is being input from disk drive interface 24 into error correction system 20, i.e., at clock cycle 8, the value from symbol generator 30 on line AO3 (see FIG. 3), which value is also called S1, is $R(\alpha)\alpha^{-1}$. At the same time, the value on line AO4 (also called S2) is $R(\alpha^2)\alpha^{-2}$; the value on line AO1 is P0 and the value on line AO2 is P1.

If L is even then:

$$\alpha^L = \alpha S1/(P0+\alpha P1) \qquad \text{EQUATION 8}$$

and $$\alpha^{2L} = \alpha^2 S2/(P0+\alpha^2 P1) \qquad \text{EQUATION 9}$$

Taking logs of Equations 8 and 9:

$$L=\log(S1)-\log(\alpha^{-1}P0+P1) \qquad \text{EQUATION 10}$$

and $$L=(\log(S2)-\log(\alpha^{-2}P0+P1))/2 \qquad \text{EQUATION 11}$$

If L is odd then:

$$\alpha^L = \alpha S1/(P1+\alpha P0) \qquad \text{EQUATION 12}$$

and $$\alpha^{2L} = \alpha^2 S2/(P1+\alpha^2 P0) \qquad \text{EQUATION 13}$$

Taking logs of Equations 12 and 13:

$$L=\log(S1)-\log(\alpha-1P1+P0) \qquad \text{EQUATION 14}$$

and $$L=(\log(S2)-\log(\alpha^{-2}P1+P0))/2 \qquad \text{EQUATION 15}$$

The four calculations for L as indicated by Equations 10, 11, 14, 15, are denoted in order as LEVEN1, LEVEN2, LODD1 and LODD2, and are also referred to as the four reference address candidates. These determinations are summarized in Equations 16.

$$LEVEN1=\log(S1)-\log(\alpha^{-1}P0+P1) LEVEN2=(\log(S2)-\log(\alpha^{-2}P0+P1))/2 LODD1=\log(S1)-\log(\alpha^{-1}P1+P0) LODD2=(\log(S2)-\log(\alpha^{-2}P1+P0))/2 \qquad \text{EQUATIONS 16}$$

The four above determinations/candidates for L are made in step 1108 by calculation circuit 70, particularly utilizing log units 710, 712, the negative log determination units 704, and adders 700. In such determination, controller 100 issues select signals to require MUXes $702_{5-2}$–$702_{8-2}$ to select their "1" input terminals and to require MUXes $702_{5-1}$–$702_{8-1}$ to select their "0" input terminals. In connection with calculation circuit 70, it is noted that adders $720_5$–$720_8$ perform GF(16) addition and adders $700_5$–$700_8$ perform integer addition modulo 15.

In step 1108, as far as calculation circuit 70 is concerned, LEVEN1 is generated on line LAO8; LEVEN2*2 is generated on line LAO6; LODD1 is generated on LAO7; and LODD2.2 is generated on line LAO5. During step 1108 these values are transmitted to LSAVE switching subsystem 90 (see FIG. 9). LSAVE switching subsystem 90, particularly MUX 900, then selects between LEVEN1, LEVEN2 (output from divider $902_E$), LODD1, and LODD2 (output from divider $902_O$).

For purposes of discussion, now define ENA_EVEN as in Equation 17.

$$ENA\_EVEN=(S1=0)((P0+\alpha P1)=0)+(S2=0)((P0+\alpha 2P1)=0)+(S1!=0)(S2!=0)(LEVEN1=LEVEN2) \qquad \text{EQUATION 17}$$

In Equation 17, for example, "S1=0" is 1 if S1=0 and 0 otherwise. Moreover, in Equation 17 "!=" means "does not equal".

As seen in FIG. 9, the signal LSAVE is the output of MUX 900. In particular, controller 100 causes MUX 900 to select one of its four input values, i.e., one of the four values LEVEN1, LEVEN2, LODD1, and LODD2(as discussed above), based on the following predetermined selection Rule:

If ENA_EVEN is 1 and S1 is not 0, then select LEVEN1.
If ENA_EVEN is 1 and S1 is 0, then select LEVEN2.
If ENA_EVEN is 0 and S1 is not 0, then select LODD1.
If ENA_EVEN is 0 and S1 is 0, then select LODD2. By the end of clock 8, the value of LSAVE is routed to symbol generator 30, particularly register 300$_3$, via MUX 302$_3$. In this regard, controller 100 issues a select signal to require MUX 302$_3$ to gate its input terminal "2" into register 300$_3$.

Assuming that errors occurred in the received data symbols D$_n$, at step 1110, which follows the eighth decoding clock cycle, error shifter or SHF 802 of error processor 80 (see FIG. 8) puts the error burst in the proper position on the 32-bit bus ERR. In connection with step 1110, usage of the error burst to set bits on the bus ERR is in according with the following (the bit numbers of bus ERR being indicated in parentheses):

ERR(31:28)=P1 if L=14 and 0000 otherwise
ERR(27:24)=P0 if L=14 or L=13 and 0000 otherwise
ERR(23:20)=P1 if L=13 or L=12 and 0000 otherwise
ERR(19:16)=P0 if L=12 or L=11 and 0000 otherwise
ERR(15:12)=P1 if L=11 or L=10 and 0000 otherwise
ERR(11:8)=P0 if L=10 or L=9 and 0000 otherwise
EERR(7:4)=P1 if L=9 or L=8 and 0000 otherwise
ERR(3:0)=P0 if L=8 or L=7 and 0000 otherwise In connection with the foregoing, during the ninth decoding clock cycle and at step 1110, the value of P0 is applied from register 300$_1$ to error pattern generator 802 on line REG1; the value of P1 is applied from register 300$_2$ to error pattern generator 802 on line REG2; and the value of L (i.e., LSAVE) is applied to error pattern generator 802 from register 300$_3$ on line REG3. Based on the input value P0, P1, and L, error pattern generator 802 outputs the error pattern on bus ERR.

CORRECTION CHECKING OPERATION

Returning to a discussion of processing during the eighth decoding clock cycle and step 1108, if error correction system 20 detects an uncorrectable error, then a system output signal or flag UNC_ERR is set. Error correction system 20 detects an uncorrectable error if the syndromes do not correspond to a correctable error. Uncorrectability occurs when any of the following conditions exists:

CONDITION 1: P0 is zero and P1 is non-zero or P1 is zero and P0 is non-zero (indicating a single-nibble error) and S1 is zero or S2 is zero CONDITION 2: S1 is zero and $\alpha^{-1}$P0+P1 is non-zero and $\alpha^{-2}$P1+P0 is non-zero CONDITION 3: S2 is zero and $\alpha^{-2}$P0+P1 is non-zero and $\alpha^{-2}$P1+P0 is non-zero CONDITION 4: S1 is non-zero and S2 is non-zero and LEVEN1 does not match LEVEN2 and LODD1 does not match LODD2

CONDITION 5: ENA_EVEN is ON but the selected L is odd or ENA_EVEN is OFF but the selected L is even Step 1112 depicts a checking operation which occurs after the eighth decoding clock cycle. In the checking operation, validity of the error pattern outputted on bus ERR is checked by XORing (i.e., comparing or summing) the negative logs of four certain CRCs of the calculated error pattern (also known as error CRCs or ECs) with the values in the four registers 300$_5$–300$_8$, respectively. If any of these sums are non-zero, the uncorrectable flag UNC_ERR is set to 1.

The error CRCs or ECs referred to above in connection with step 1112 are determined by Equation 18.

$$EC_k = (DE(X)X + ERC_k)X^2 \bmod (X + \alpha^{3+k}) =$$
$$(DE(\alpha^{3+k})\alpha^{3+k} + ERC_k)\alpha^{2(3+k)} =$$
$$DE(\alpha^{3+k})\alpha^{3(3+k)} + ERC_k\alpha^{2(3+k)}$$

EQUATION 18:

for k=0,1,2,3.

In Equation 18, DE(X) is the error polynomial in the data area and ERC$_k$ is the error that occurred in the received CR$_k$ symbol.

$$DE(X) = \quad 0, \qquad\qquad\qquad L < 7$$
$$\qquad ERRH\ X^{L-7}, \qquad\qquad L = 7$$
$$\qquad ERRH\ X^{L-7} + ERRL\ X^{L-8}, \quad L > 7.$$

Therefore:

$$DE(\alpha^{3+k})\alpha^{3(3+k)} = \quad 0, \qquad\qquad\qquad\qquad L < 7$$
$$\qquad (ERRH)\alpha^{(3+k)(L-4)}, \qquad\qquad L = 7$$
$$\qquad (ERRH + ERRL\alpha^{-(3+k)})\alpha^{(3+k)(L-4)}, \quad L > 7$$

$$ERC_k = \quad 0, \qquad L < k+3\ \text{or}\ L > k+4$$
$$\qquad ERRH, \quad L = k+3$$
$$\qquad ERRL, \quad L = k+4.$$

Therefore:

$$ERC_k\alpha^{2(3+k)} = \quad 0, \qquad\qquad\qquad\qquad L < k+3\ \text{or}\ L > k+4$$
$$\qquad ERRH\ \alpha^{-(3+k)}\alpha^{(3+k)(3)}, \quad L = k+3$$
$$\qquad ERRL\ \alpha^{-(3+k)}\alpha^{(3+k)(3)}, \quad L = k+4.$$

Combining the foregoing expressions for errors that occur in data or CR, Equation 19 results.

$$EC_k = B_k\alpha^{(3+k)(LCRC-4)}, k=0,1,2,3 \qquad \text{EQUATION 19}$$

In Equation 19 LCRC is the greater of L or 7 and B$_k$ is defined by Equation 20.

$$B_k = (ERRH)(ENA\_DEH) + \qquad\qquad \text{EQUATION 20:}$$
$$\qquad (ERRL)(ENA\_DEL)\ \alpha^{-(3+k)},$$
$$\qquad \text{for}\ k < 3\ \text{and}\ (L = k+4\ \text{or}\ L > 6)$$
$$= (ERRH)(ENA\_DEH) + ERRL\ \alpha^{-(3+k)},$$
$$\qquad \text{for}\ k = 3\ \text{and}\ L > 6$$
$$= ERRH\ \alpha^{-(3+k)} \qquad \text{otherwise}.$$

In Equation 20, ENA_DEL is 1 when L is not 7 and ENA_DEH is 1 when L is greater than 6.

Equation 21 is an expression of the negative logs of the four values EC$_k$ which are to be compared with the values in registers 300$_5$–300$_8$ (the negative logs of the CRC check values).

$$\log(EC_k)=15, \text{ for } B_k=0 \text{ or } L<k+3 \text{ or } k+4<L<7-\log(B_k)-(3+k)$$
$$(LCRC-4), \text{ otherwise.} \qquad \text{EQUATION 21}$$

The four B$_k$ values, i.e., the B$_k$ values for k=0 to 3, as set forth in Equation 20, are generated by the linear combination circuit 50 of FIG. 5. To this end, controller 100 issues select signals for commanding MUXes 500L and 500H to select their "1" input terminals whereby the ERR inputs (ERRL for MUX 500L and ERRH for MUX 500H) are selected. Moreover, controller 100 directs that MUXes 510$_{k+5}$ select input "0" if L=k+4 or L>6 and select input "1" otherwise. The output lines A$_{k+5}$ (i.e., lines A5–A8) of circuit 50 (see FIG. 5) will then carry the four B$_k$ values.

The four B$_k$ values carried on lines A5–A8 are fed into respective four negative log determination units 704$_5$–704$_8$ of calculation circuit 70 (see FIG. 7). Application of the four $B_k$ values occurs as controller 100 requires MUXes $702_{5-2}$–$702_{8-2}$ to select their input terminals "2", thereby gating the $B_k$ values on lines A5–A8 to the negative log determination units $704_5$–$704_8$. The negative log determination units $704_5$–$704_8$ feed second input terminals of their respective adders $700_5$–$700_8$. Adder input MUXes $702_{5-1}$–$702_{8-1}$ are required by controller 100 to select their "1" input terminals, thereby allowing the first input terminals of adders $700_5$–$700_8$ to receive the outputs of modulo multiplication unit 714. The outputs of modulo multiplication unit 714 are $X_{k+3}$, where $X_{k+3}$ is defined by Equation 22.

$$X_{k+3} = (3+k)(LCRC-4) \bmod 15 \text{ for } k=0 \text{ to } 3. \quad \text{EQUATION 22}$$

LCRC is obtained from mux 716 which feeds modulo multiplication unit 714, with MUX 716 selecting the low order three bits of L (input 0) if L>7 and 7 (input 1) otherwise.

The outputs of adders $700_5$–$700_8$ are applied on lines LAO5–LAO8 to generator input switching subsystem 40. In generator input switching subsystem 40, the outputs of adders $700_5$–$700_8$ are placed by DIN MUXes $700_5$–$700_8$ on lines DIN5–DIN8, respectively, as MUXes 400 are required to select their "2" input terminals. For cases, listed above, where $-\log(EC_k)=15$, i.e. $B_k=0$ or L<k+3 or k+4<L<7, MUX $700_{k+5}$ places 15 (input 3) on its output line. As a result of the addition by adders $304_5$–$304_8$, lines AO5 to AO8 then will have non-zero values if the error CRCs (ECs) do not match the CRC checks.

As stated previously, error correction system 20 is particularly adapted for encoding and decoding headers, e.g., identification information, for sectors which are stored on or retrieved from a rotating magnetic recording medium. It should thus be understood that error correction system can function as a header subsystem in the context of the error correction system disclosed in U.S. patent application Ser. No. 08/326,126, filed Oct. 18, 1994, entitled "ERROR CORRECTION METHOD AND APPARATUS", which is incorporated herein by reference. Also incorporated herein as disclosing various subsystems are U.S. patent application Ser. No. 08/325,717 entitled "CYCLIC REDUNDANCY CHECK METHOD AND APPARATUS", U.S. patent application Ser. No. 08/326,164 entitled "REED SOLOMON DECODER"; and U.S. patent application Ser. No. 08/325,831 entitled "FINITE FIELD INVERSION", and U.S. patent application Ser. No. 08/325,850 entitled "BURST ERROR CORRECTOR". The aforementioned U.S. patent application Ser. No. 08/326,126, filed Oct. 18, 1994, entitled "ERROR CORRECTION METHOD AND APPARATUS" is, in turn, a continuation-in-part of the following patent applications (all of which are also incorporated herein by reference): U.S. patent application Ser. No. 08/147,865 entitled "DUAL PURPOSE CYCLIC REDUNDANCY CHECK", U.S. patent application Ser. No. 08/147,650, entitled "REED SOLOMON DETECTOR"; and U.S. patent application Ser. No. 08/147,758 entitled "FINITE FIELD INVERSION"; U.S. patent application Ser. No. 08/148,068 entitled "BURST ERROR CORRECTOR"; U.S. patent applications Ser. No. 08/310,973 filed Sep. 23, 1994 and entitled "A METHOD AND APPARATUS FOR DETECTING THE TRANSFER OF A WRONG SECTOR"; and U.S. patent application Ser. No. 08/124,936 of Zook and Glover, filed Sep. 21, 1993 and entitled "PROGRAMMABLE REDUNDANCY/SYNDROME GENERATOR".

TABLE 1

LOG

| INPUT | OUTPUT |
|---|---|
| 0000 | 1111 |
| 0001 | 0000 |
| 0010 | 0001 |
| 0011 | 0100 |
| 0100 | 0010 |
| 0101 | 1000 |
| 0110 | 0101 |
| 0111 | 1010 |
| 1000 | 0011 |
| 1001 | 1110 |
| 1010 | 1001 |
| 1011 | 0111 |
| 1100 | 0110 |
| 1101 | 1101 |
| 1110 | 1011 |
| 1111 | 1100 |

TABLE 2

NEG LOG

| INPUT | OUTPUT |
|---|---|
| 0000 | 1111 |
| 0001 | 0000 |
| 0010 | 1110 |
| 0011 | 1011 |
| 0100 | 1101 |
| 0101 | 0111 |
| 0110 | 1010 |
| 0111 | 0101 |
| 1000 | 1100 |
| 1001 | 0001 |
| 1010 | 0110 |
| 1011 | 1000 |
| 1100 | 1001 |
| 1101 | 0010 |
| 1110 | 0100 |
| 1111 | 0011 |

TABLE 3

MOD MULT

| INPUT | X3 | X4 | X5 | X6 |
|---|---|---|---|---|
| 000 | 0011 | 1110 | 1010 | 0110 |
| 001 | 0000 | 1010 | 0101 | 0000 |
| 010 | 1100 | 0110 | 0000 | 1001 |
| 011 | 1001 | 0010 | 1010 | 0011 |
| 100 | 0110 | 1101 | 0101 | 1100 |
| 101 | 0011 | 1001 | 0000 | 0110 |
| 110 | 0000 | 0101 | 1010 | 0000 |
| 111 | 0110 | 0011 | 0000 | 1100 |

While the invention has been particularly shown and described with reference to the preferred embodiments thereof, it will be understood by those skilled in the art that various alterations in form and detail may be made therein without departing from the spirit and scope of the invention.

The embodiments of the invention in which an exclusive property or privilege is claimed are defined as follows:

1. A method of decoding a sequence of error correcting symbols received from a disk drive using an error correction system which operates on clock cycles, the method comprising:

(1) obtaining symbols of the sequence from the disk drive during a plurality of reception clock cycles and using the symbols to generate error pattern bits during the plurality of reception clock cycles;

(2) determining a reference address in an output error pattern for the error pattern bits prior to completion of a last of the plurality of reception clock cycles; and (3) inserting the error pattern bits at the reference address in the output error pattern during a next clock cycle after the last of the plurality of reception clock cycles.

2. The method of claim 1, wherein data symbols of the sequence received from the disk drive contain sector identifying information.

3. The method of claim 1, wherein the sequence received from the disk drive consists of eight bytes, and wherein eight error pattern bits are generated during step (2).

4. The method of claim 1, further comprising:

generating a plurality of syndromes and a plurality of parity values with respect to the sequence during the plurality of reception clock cycles, and using the plurality of syndromes and the plurality of parity values to determine the reference address.

5. The method of claim 4, wherein the received sequence is $R(x)$, wherein the plurality of syndromes include a first syndrome S1 and a second syndrome S2, and wherein $S1=R(\alpha)\alpha^-$ and $S2=R(\alpha^2)\alpha^{-2}$.

6. The method of claim 4, wherein two symbols from the sequence are received from the disk drive during each reception clock cycle, wherein the plurality of parity values includes an even symbol interleave parity value and an odd symbol interleave parity value, and wherein the step of determining the reference address comprises:

generating a plurality of reference address candidates; and then selecting one of the reference address candidates to be the reference address based on a predetermined selection rule.

7. The method of claim 4, using the plurality of syndromes and the plurality of parity values to check whether the received sequence is uncorrectable.

8. The method of claim 1, further comprising using the symbols of the sequence obtained from the disk drive during a plurality of reception clock cycles to form regenerated CRC values.

9. The method of claim 8, further comprising adding the regenerated CRC values to CRC values obtained from the sequence to obtain CRC check values.

10. The method of claim 9, further comprising using the CRC check values to verify correctness of the error pattern.

11. The method of claim 10, wherein the step of using the CRC check values to verify correctness of the error pattern occurs in a next clock cycle immediately following the last of the plurality of reception clock cycles.

12. The method of claim 10, wherein using the CRC check values to verify correctness of the error pattern comprises:

generating error EC values using an error polynomial over data symbols received in the sequence and an error polynomial over CRC symbols received in the sequence;

adding the CRC check values to the EC values;

using a result of the adding to determine if the received sequence is uncorrectable.

13. The method of claim 12, wherein using the CRC check values to verify correctness of the error pattern comprises:

determining negative logarithms of the CRC check values;

determining negative logarithms of the EC values;

adding the negative logarithms of the CRC check values to the negative logarithms of the EC values;

using a result of the adding to determine if the received sequence is uncorrectable.

14. A method of decoding a sequence $R(x)$ of error correcting symbols received from a disk drive using an error correction system, the method comprising:

(a) obtaining symbols of the sequence from the disk drive and using the symbols to generate (1) error pattern bits; (2) a first syndrome S1 and a second syndrome S2, S1 being a multiple of $R(\alpha)$ and S2 being a multiple of $R(\alpha^2)$; and (3) a plurality of parity values;

(b) using the first and second of syndromes and the plurality of parity values to determine a reference address in an output error pattern for the error pattern bits; and (c) inserting the error pattern bits at the reference address in the output error pattern.

15. The method of claim 14, wherein the method is conducted on a basis of clock cycles, and wherein steps (a) and (b) are conducted during a plurality of reception clock cycles in which the symbols are received from the disk drive; and wherein step (c) is conducted in a step which immediately follows a last of the plurality of reception clock cycles.

16. The method of claim 14, wherein data symbols of the sequence received from the disk drive contain sector identifying information.

17. The method of claim 14, wherein the sequence received from the disk drive consists of eight bytes, and wherein eight error pattern bits are generated during step (b).

18. The method of claim 17, wherein two symbols from the sequence are received from the disk drive during each reception clock cycle, wherein the plurality of parity values includes an even symbol interleave parity value and an odd symbol interleave parity value, and wherein the step of determining the reference address comprises:

generating a plurality of reference address candidates; and then selecting one of the reference address candidates to be the reference address based on a predetermined selection rule.

19. The method of claim 17, using the plurality of syndromes and the plurality of parity values to check whether the received sequence is uncorrectable.

20. The method of claim 14, further comprising using the symbols of the sequence obtained from the disk drive during a plurality of reception clock cycles to form regenerated CRC values.

21. The method of claim 20, further comprising adding the regenerated CRC values to CRC values obtained from the sequence to obtain CRC check values.

22. The method of claim 21, further comprising using the CRC check values to verify correctness of the error pattern.

23. The method of claim 22, wherein the step of using the CRC check values to verify correctness of the error pattern occurs in a next clock cycle immediately following the last of the plurality of reception clock cycles.

24. The method of claim 22, wherein using the CRC check values to verify correctness of the error pattern comprises:

generating error EC values using an error polynomial over data symbols received in the sequence and an error polynomial over CRC symbols received in the sequence;

adding the CRC check values to the EC values;

using a result of the adding to determine if the received sequence is uncorrectable.

25. The method of claim 24, wherein using the CRC check values to verify correctness of the error pattern comprises:

determining negative logarithms of the CRC check values;

determining negative logarithms of the EC values;

adding the negative logarithms of the CRC check values to the negative logarithms of the EC values;

using a result of the adding to determine if the received sequence is uncorrectable.

26. A method of decoding a sequence of error correcting symbols received from a disk drive using an error correction system, the method comprising:

(1) obtaining symbols of the sequence from the disk drive and using the symbols to generate (1) error pattern bits, and (2) regenerated CRC values;

(2) determining a reference address in an output error pattern for the error pattern bits;

(3) adding the regenerated CRC values to CRC values obtained from the sequence to obtain CRC check values;

(4) inserting the error pattern bits at the reference address in the output error pattern; and, (5) determining and using negative logarithms of the CRC check values to verify correctness of the error pattern.

27. The method of claim 26, wherein the error correction system operates on clock cycles, and wherein steps (1)–(3) are completed before an expiration of a plurality of reception clock cycles in which the sequence is received from the disk drive, and wherein step (4) is conducted during a clock cycle which immediately follows a last of the plurality of reception clock cycles.

28. The method of claim 27, wherein step (5) occurs in a next clock cycle immediately following the last of the plurality of reception clock cycles.

29. The method of claim 26, wherein the step of using the CRC check values to verify correctness of the error pattern further comprises:

generating error EC values using an error polynomial over data symbols received in the sequence and an error polynomial over CRC symbols received in the sequence;

determining negative logarithms of the EC values;

adding the negative logarithms of the CRC check values to the negative logarithms of the EC values;

using a result of the adding to determine if the received sequence is uncorrectable.

30. The method of claim 26, wherein data symbols of the sequence received from the disk drive contain sector identifying information.

31. The method of claim 26, wherein the sequence received from the disk drive consists of eight bytes, and wherein eight error pattern bits are generated during step (2).

32. The method of claim 26, further comprising:

generating a plurality of syndromes and a plurality of parity values with respect to the sequence during the plurality of reception clock cycles, and using the plurality of syndromes and the plurality of parity values to determine the reference address.

33. The method of claim 32, wherein the received sequence is R(x), wherein the plurality of syndromes include a first syndrome S1 and a second syndrome S2, and wherein S1 is a multiple of $R(\alpha)$ and S2 is a multiple of $R(\alpha^2)$.

34. The method of claim 32, wherein two symbols from the sequence are received from the disk drive during each reception clock cycle, wherein the plurality of parity values includes an even symbol interleave parity value and an odd symbol interleave parity value, and wherein the step of determining the reference address comprises:

generating a plurality of reference address candidates; and then selecting one of the reference address candidates to be the reference address based on a predetermined selection rule.

35. The method of claim 32, using the plurality of syndromes and the plurality of parity values to check whether the received sequence is uncorrectable.

36. An error correction system which operates on clock cycles to decode a sequence of error correcting symbols received from a disk drive, the system comprising:

a generator which receives symbols of the sequence during a plurality of reception clock cycles and which, during the plurality of reception clock cycles, generates error pattern bits;

an error address determinator which determines, during a last of the reception clock cycles, a reference address of an error burst in a data symbol portion of the sequence; and an error pattern generator which inserts the error pattern bits at the reference address in an output error pattern during a next clock cycle after the last of the plurality of reception clock cycles.

37. The system of claim 36, wherein the generator also uses the symbols of the sequence to generate regenerated CRC values, and further uses the regenerated CRC values and CRC symbols of the sequence to generate CRC check values.

38. The system of claim 37, further comprising:

a circuit for generating factors for determining error CRC values;

a calculator which generates negative logarithm values of (1) the CRC check values, and (2) the error CRC values.

39. The system of claim 38, further comprising a controller which evaluates negative logarithm values of (1) the CRC check values, and (2) the error CRC values to determine if the sequence is uncorrectable.

40. The system of claim 38, wherein the circuit for generating factors for determining error CRC values is a linear combination circuit.

41. The system of claim 40, wherein two symbols from the sequence are received from the disk drive during each reception clock cycle, wherein the linear combination circuit is also used to linearly combine symbols in a manner to enable the generator to generate regenerated CRC values.

42. The system of claim 37, wherein the error correction system uses the CRC check values to verify correctness of the error pattern.

43. The system of claim 42, wherein the error correction system checks values to verify correctness of the error pattern occurs in a next clock cycle immediately following the last of the plurality of reception clock cycles.

44. The system of claim 36, wherein data symbols of the sequence received from the disk drive contain sector identifying information.

45. The system of claim 36, wherein the sequence received from the disk drive consists of eight bytes, and wherein eight error pattern bits are generated by the error pattern generator.

46. The system of claim 36, wherein the generator also generates a plurality of syndromes and a plurality of parity values with respect to the sequence during the plurality of reception clock cycles, and wherein the error address determinator uses the plurality of syndromes and the plurality of parity values to determine the reference address.

47. The system of claim 46, wherein the received sequence is R(x), wherein the plurality of syndromes include a first syndrome S1 and a second syndrome S2, and wherein S1 is a multiple of $R(\alpha)$ and S2 is a multiple of $R(\alpha^2)$.

48. The system of claim 46, wherein two symbols from the sequence are received from the disk drive during each reception clock cycle, wherein the plurality of parity values includes an even symbol interleave parity value and an odd symbol interleave parity value, and wherein the generator generates a plurality of reference address candidates, and wherein the address determinator is used to select one of the reference address candidates to be the reference address based on a predetermined selection rule.

49. The system of claim 46, further comprising a controller which uses the plurality of syndromes and the plurality of parity values to check whether the received sequence is uncorrectable.

50. The system of claim 36, wherein the generator comprises a plurality of divider circuits, including:
a first set of divider circuits in which parity values are tabulated during a decoding operation using the symbols of the received sequence;
a second set of divider circuits wherein syndrome values are generated during the decoding operation;
a third set of divider circuits, the third set of divider circuits being used during the decoding operation for generation of regenerated CRC values and generation of CRC check values.

51. The system of claim 50, wherein
the first set of divider circuits are used to tabulate parity values during an encoding operation;
the second set of divider circuits are used to output error correction symbols during the encoding operation;
the third set of divider circuits are used to generate cyclic redundancy check symbols during the encoding operation.

52. An error correction system which decodes a sequence of error correcting symbols received from a disk drive, the system comprising:
a generator which receives symbols of the sequence and which generates error pattern bits and regenerated CRC values, and which further uses the regenerated CRC values and CRC symbols of the sequence to generate CRC check values;
an error address determinator which determines a reference address of an error burst in a data symbol portion of the sequence;
an error pattern generator which inserts the error pattern bits at the reference address in an output error pattern;
a circuit for generating factors for determining error CRC values;
a calculator which generates negative logarithm values of (1) the CRC check values, and (2) the error CRC values; and,
a controller which evaluates negative logarithm values of (1) the CRC check values, and (2) the error CRC values to verify accurate generation of the output error pattern.

53. The system of claim 52, wherein the circuit for generating factors for determining error CRC values is a linear combination circuit.

54. The system of claim 53, wherein two symbols from the sequence are received from the disk drive during each reception clock cycle, wherein the linear combination circuit is also used to linearly combine symbols in a manner to enable the generator to generate regenerated CRC values.

55. The system of claim 52, wherein data symbols of the sequence received from the disk drive contain sector identifying information.

56. The system of claim 52, wherein the sequence received from the disk drive consists of eight bytes, and wherein eight error pattern bits are generated by the error pattern generator.

57. The system of claim 52, wherein the generator also generates a plurality of syndromes and a plurality of parity values with respect to the sequence during the plurality of reception clock cycles, and wherein the error address determinator uses the plurality of syndromes and the plurality of parity values to determine the reference address.

58. The system of claim 57, wherein the received sequence is R(x), wherein the plurality of syndromes include a first syndrome S1 and a second syndrome S2, and wherein S1 is a multiple of $R(\alpha)$ and S2 is a multiple of $R(\alpha^2)$.

59. The system of claim 57, wherein two symbols from the sequence are received from the disk drive during each reception clock cycle, wherein the plurality of parity values includes an even symbol interleave parity value and an odd symbol interleave parity value, and wherein the generator generates a plurality of reference address candidates, and wherein the address determinator is used to select one of the reference address candidates to be the reference address based on a predetermined selection rule.

60. The system of claim 57, further comprising a controller which uses the plurality of syndromes and the plurality of parity values to check whether the received sequence is uncorrectable.

61. The system of claim 52, wherein the generator comprises a plurality of divider circuits, including:
a first set of divider circuits in which parity values are tabulated during a decoding operation using the symbols of the received sequence;
a second set of divider circuits wherein syndrome values are generated during the decoding operation;
a third set of divider circuits, the third set of divider circuits being used during the decoding operation for generation of regenerated CRC values and generation of CRC check values.

62. The system of claim 61, wherein
the first set of divider circuits are used to tabulate parity values during an encoding operation;
the second set of divider circuits are used to output error correction symbols during the encoding operation;
the third set of divider circuits are used to generate cyclic redundancy check symbols during the encoding operation.

63. Apparatus for encoding received data for recording on a magnetic storage medium, the apparatus comprising a symbol generator which uses the received data to generate a codeword comprising data symbols, a plurality of CRC symbols generated over the data symbols, and error correction symbols $E_0$, $E_1$, $E_2$, and $E_3$ generated over both the data symbols and the CRC symbols, the error correction symbols being generated whereby $E_2$ and $E_3$ symbols are parity symbols over the entire codeword divided into two interleaves and $E_1$ and $E_0$ are chosen so that the codeword polynomial has $\alpha^2$ and $\alpha^1$ as roots.

64. The apparatus of claim 63, wherein the symbol generator includes a plurality of divider circuits, the divider circuits including:

a first divider circuit for generating an even interleave parity value P0 over even interleave data symbols $D_n$ and even interleave CRC symbols $CR_n$;

a second divider circuit for generating an odd interleave parity value P1 over odd interleave data symbols $D_n$ and odd interleave CRC symbols $CR_n$.

65. The apparatus of claim 64, further comprising:

a third divider circuit for contributing to $E_0$;

a fourth divider circuit for contributing to $E_1$;

a fifth divider circuit for generating $CR_0$;

a sixth divider circuit for generating $CR_1$;

a seventh divider circuit for generating $CR_2$; and an eighth divider circuit for generating $CR_3$.

66. The apparatus of claim 65, wherein output values from first, second, third, and fourth divider circuits are used to generate $E_0$ and $E_1$.

67. The apparatus of claim 66, wherein $E_2$ is the sum of $E_0$ and $P_0$ and $E_3$ is the sum of $E_0$ and $P_1$.

68. The apparatus of claim 63, wherein the symbol generator operates on the basis of clock cycles, and wherein two data symbols are processed during each clock cycle.

69. An error correction system which receives data symbols $D_n$ from a host device and which generates a codeword C(x) for storage of the codeword on a magnetic storage medium, the codeword being $$C(x) = \sum_{n=0}^{7} D_n X^{n+8} + \sum_{n=0}^{3} CR_n X^{n+4} + \sum_{n=0}^{3} E_n X^n$$

wherein $CR_n$ are CRC symbols and $E_n$ are error correction symbols, and wherein the error correction system includes:

symbol generation means which generates the CRC symbols $CR_n$ over the data symbols $D_n$ and the error correction symbols $E_n$, the CRC symbols $CR_n$ being defined as $$CR_k = \sum_{n=0}^{7} D_n X^{n+1} \bmod(X + \alpha^{3+k})$$

the error correction symbols $E_2$ and $E_3$ being parity symbols over the entire codeword C(x) divided into two interleaves and generated such that $$\sum_{n=0}^{7} C_{2n+k} = 0$$

for k=0, 1 where $C_j$ is the coefficient of the $X^j$ term in C(x), and wherein $E_0$ and $E_1$ are chosen so that the codeword C(x) has $\alpha^2$ and $\alpha^1$ as roots; and, means for gating the data symbols, CRC symbols, and error correction symbols of the codeword to the magnetic storage medium and the data symbols and CRC symbols of the codeword to the symbol generating means for determination of parity values.

70. The apparatus of claim 69, wherein the symbol generation means includes a plurality of divider circuits, the divider circuits including:

a first divider circuit for generating an even interleave parity value P0 over even interleave data symbols $D_n$ and even interleave CRC symbols $CR_n$;

a second divider circuit for generating an odd interleave parity value P1 over odd interleave data symbols $D_n$ and odd interleave CRC symbols $CR_n$.

71. The apparatus of claim 70, further comprising:

a third divider circuit for contributing to $E_0$;

a fourth divider circuit for contributing to $E_1$;

a fifth divider circuit for generating $CR_0$;

a sixth divider circuit for generating $CR_1$;

a seventh divider circuit for generating $CR_2$; and an eighth divider circuit for generating $CR_3$.

72. The apparatus of claim 71, wherein output values from first, second, third, and fourth divider circuits are used to generate $E_0$ and $E_1$.

73. The apparatus of claim 72, wherein $E_2$ is the sum of $E_0$ and $P_0$ and $E_3$ is the sum of $E_1$ and $P_1$.

74. The apparatus of claim 69, wherein the symbol generation means operates on the basis of clock cycles, and wherein two data symbols are processed during each clock cycle.

* * * * *